(12) United States Patent
Wang et al.

(10) Patent No.: US 11,824,566 B2
(45) Date of Patent: Nov. 21, 2023

(54) DATA DECOMPRESSION DEVICE, DATA COMPRESSION DEVICE, AND MEMORY SYSTEM

(71) Applicant: Kioxia Corporation, Tokyo (JP)

(72) Inventors: Zheye Wang, Tokyo (JP); Keiri Nakanishi, Kawasaki Kanagawa (JP); Kohei Oikawa, Kawasaki Kanagawa (JP); Masato Sumiyoshi, Yokohama Kanagawa (JP); Sho Kodama, Kawasaki Kanagawa (JP); Youhei Fukazawa, Kawasaki Kanagawa (JP); Daisuke Yashima, Tachikawa Tokyo (JP); Takashi Miura, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 64 days.

(21) Appl. No.: 17/696,756

(22) Filed: Mar. 16, 2022

(65) Prior Publication Data

US 2023/0086658 A1 Mar. 23, 2023

(30) Foreign Application Priority Data

Sep. 21, 2021 (JP) .................................. 2021-152935

(51) Int. Cl.
*H03M 7/40* (2006.01)
*H03M 7/42* (2006.01)
*H03M 7/30* (2006.01)

(52) U.S. Cl.
CPC ........... *H03M 7/4093* (2013.01); *H03M 7/42* (2013.01); *H03M 7/6005* (2013.01)

(58) Field of Classification Search
CPC ..... H03M 7/4093; H03M 7/42; H03M 7/6005
See application file for complete search history.

(56) References Cited

U.S. PATENT DOCUMENTS

| | | | | |
|---|---|---|---|---|
| 6,671,323 B1 * | 12/2003 | Tahara | ..................... | H04N 7/24 375/E7.274 |
| 6,952,432 B2 * | 10/2005 | Watanabe | .............. | H04N 19/68 370/522 |
| 7,002,998 B2 * | 2/2006 | Watanabe | .......... | H04N 21/4341 370/522 |
| 8,018,359 B2 | 9/2011 | Ogawa et al. | | |
| 8,933,824 B1 | 1/2015 | Agarwal et al. | | |
| 2003/0072309 A1 * | 4/2003 | Watanabe | .......... | H04N 21/4425 375/E7.278 |
| 2003/0086416 A1 * | 5/2003 | Watanabe | .............. | H04N 19/69 370/510 |

(Continued)

FOREIGN PATENT DOCUMENTS

| | | |
|---|---|---|
| JP | 3693636 | 9/2005 |
| JP | 2016-139958 | 8/2016 |

*Primary Examiner* — Jean B Jeanglaude
(74) *Attorney, Agent, or Firm* — Foley & Lardner LLP

(57) ABSTRACT

According to one embodiment, a data decompression device includes: a detection circuit configured to detect a boundary between a header and a payload in a compressed stream, based on boundary information in the header; a separation circuit configured to separate the header and the payload; a first decompression circuit configured to decompress a compressed coding table in the header; and a second decompression circuit configured to decompress the payload, based on an output of the first decompression circuit.

16 Claims, 16 Drawing Sheets

(56) References Cited

U.S. PATENT DOCUMENTS

| | | | |
|---|---|---|---|
| 2003/0086440 A1* | 5/2003 | Watanabe | H04N 19/68 375/E7.278 |
| 2006/0062256 A1* | 3/2006 | Watanabe | H04N 19/66 375/E7.199 |
| 2006/0062257 A1* | 3/2006 | Watanabe | H04N 21/4302 375/E7.199 |
| 2006/0078003 A1* | 4/2006 | Watanabe | H04L 1/0072 375/E7.199 |
| 2013/0099946 A1* | 4/2013 | Dickie | H03M 7/4037 341/59 |

* cited by examiner

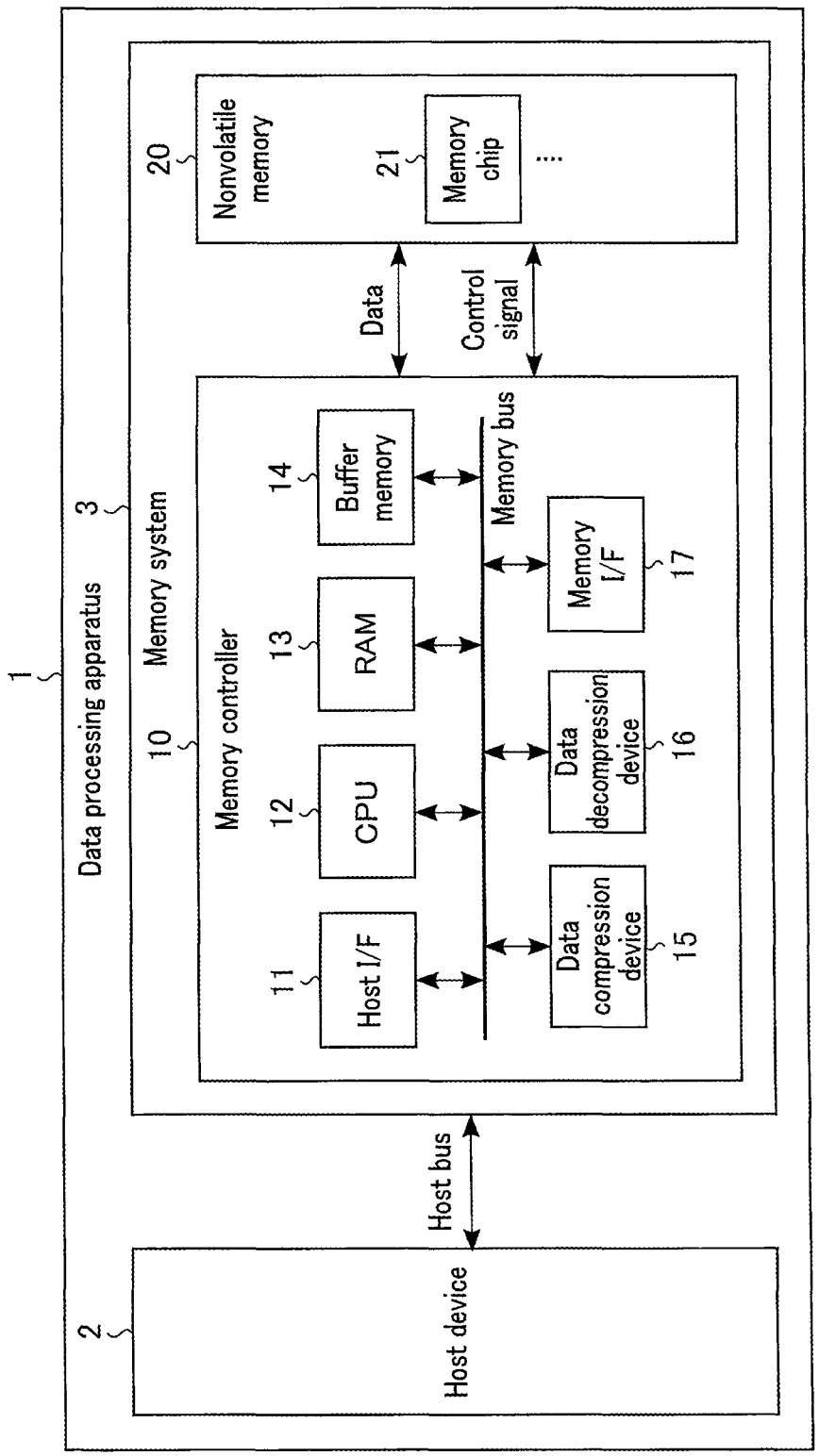
F I G. 1

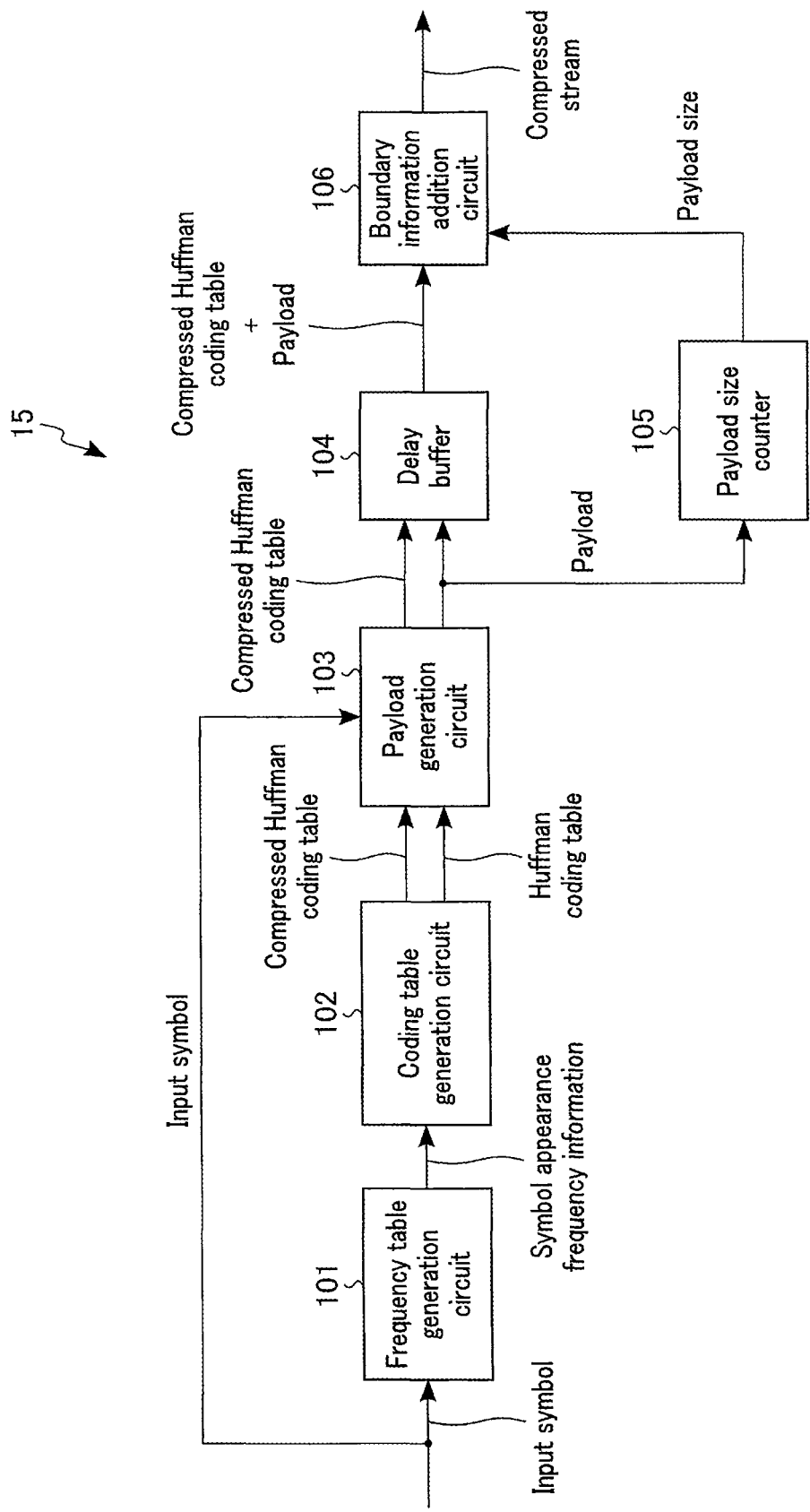
F I G. 2

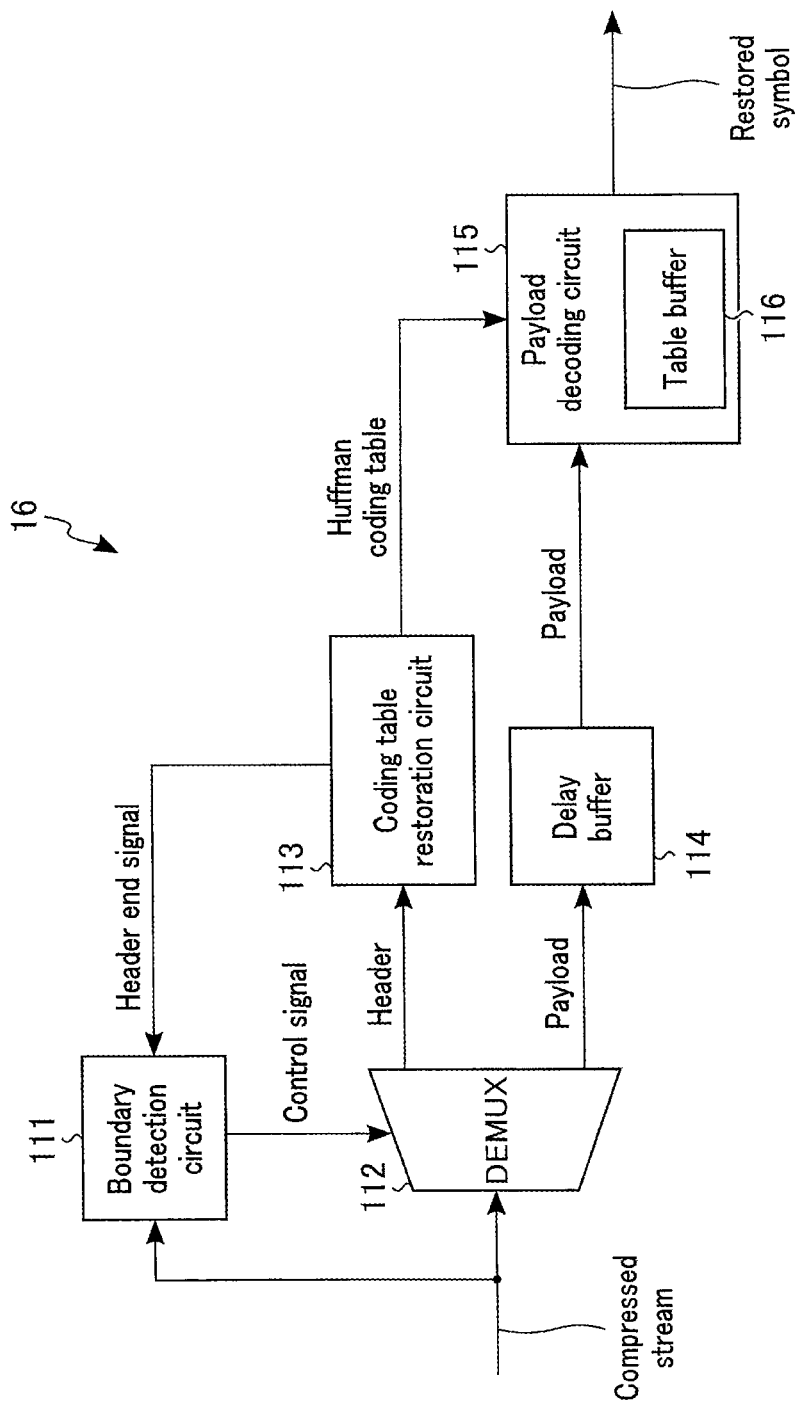
F I G. 3

| Symbol | Fixed-length code | Appearance frequency |
|---|---|---|
| A | 000 | 6 |
| B | 001 | 7 |
| C | 010 | 4 |
| D | 011 | 1 |
| E | 100 | 2 |

F I G. 4

| Symbol | Fixed-length code | Code length | Huffman codeword |
|---|---|---|---|
| A | 000 | 2 | 10 |
| B | 001 | 1 | 0 |
| C | 010 | 3 | 110 |
| D | 011 | 4 | 1111 |
| E | 100 | 4 | 1110 |

F I G. 5

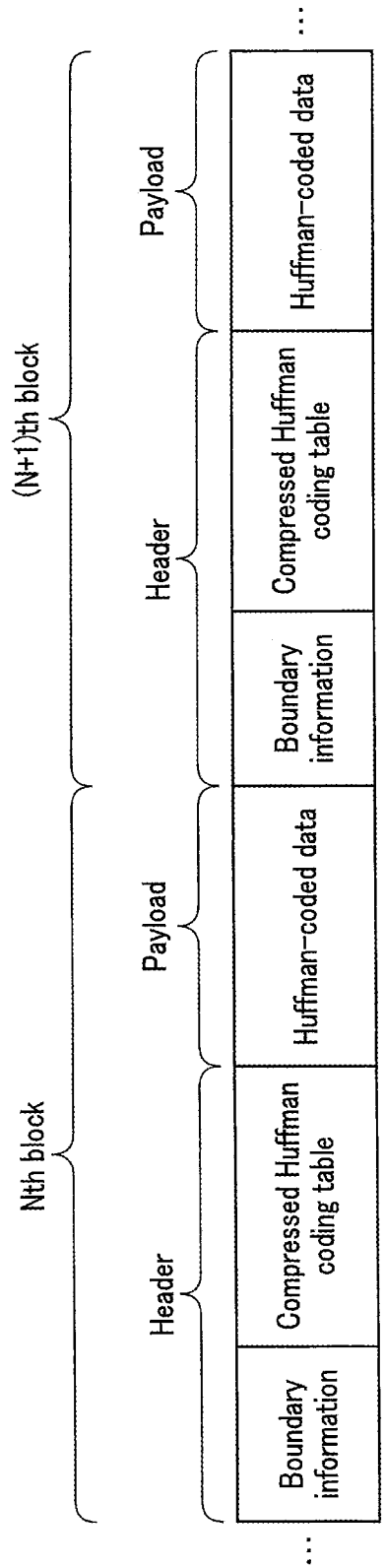
F I G. 6

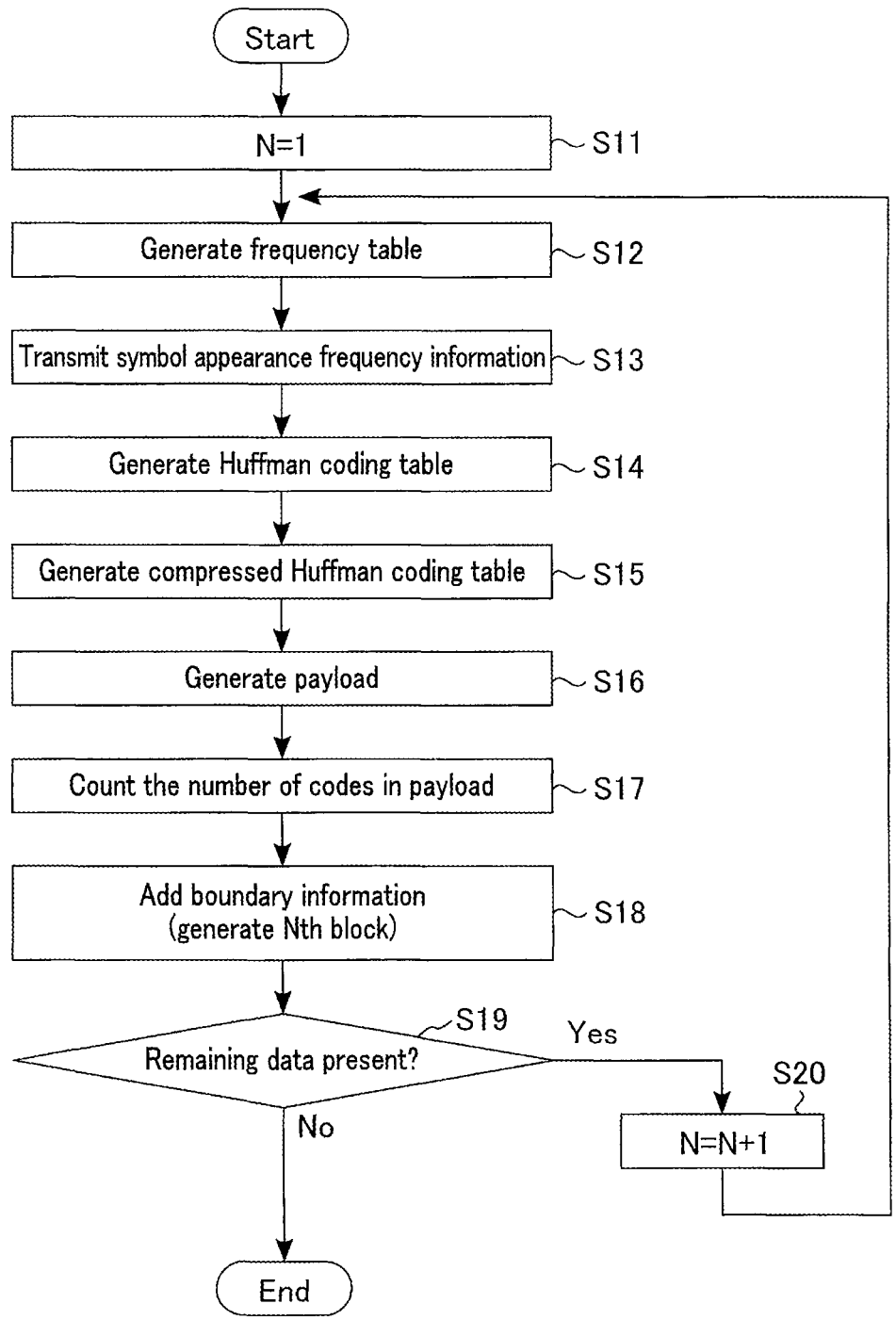
F I G. 7

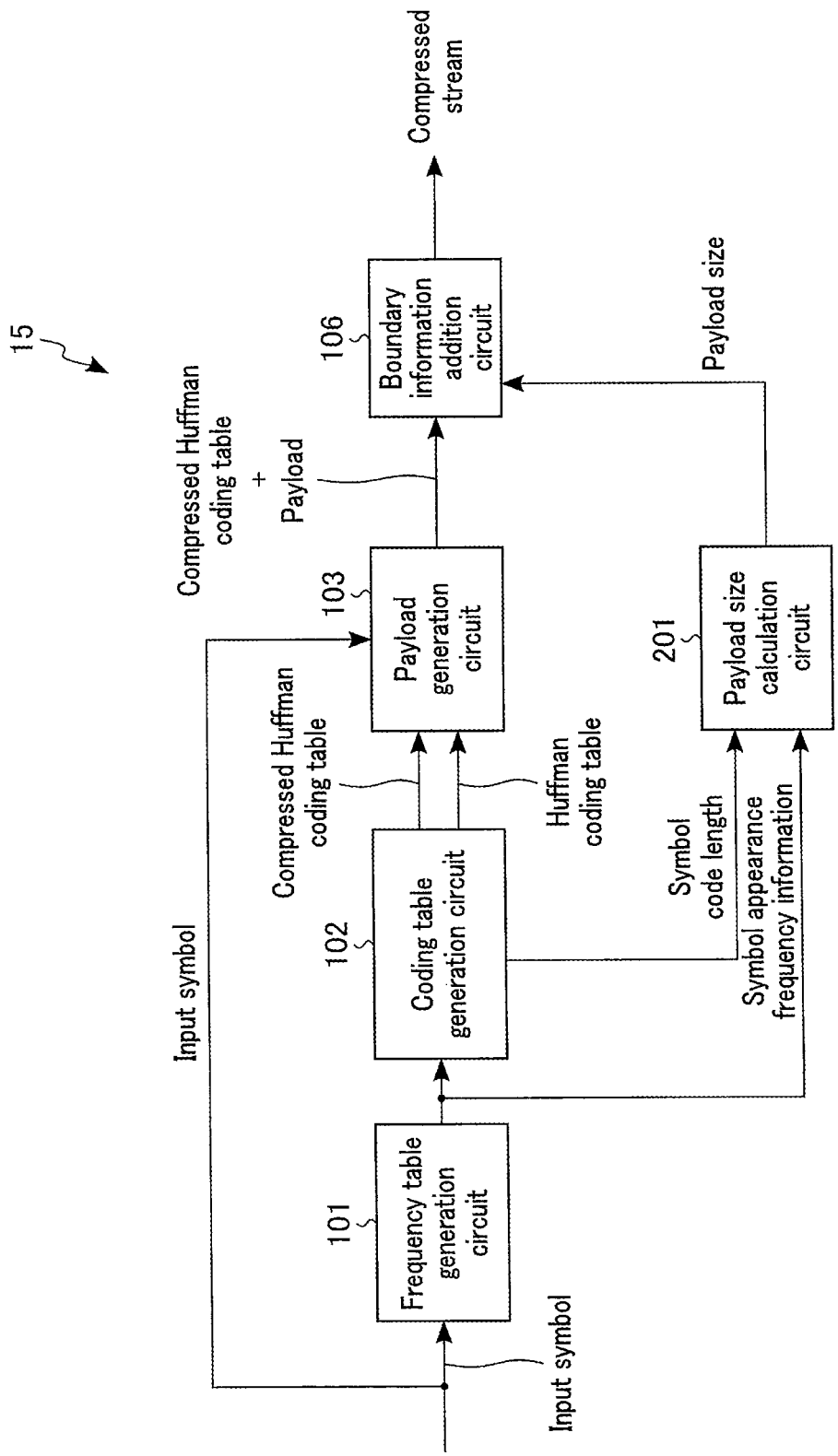
F I G. 9

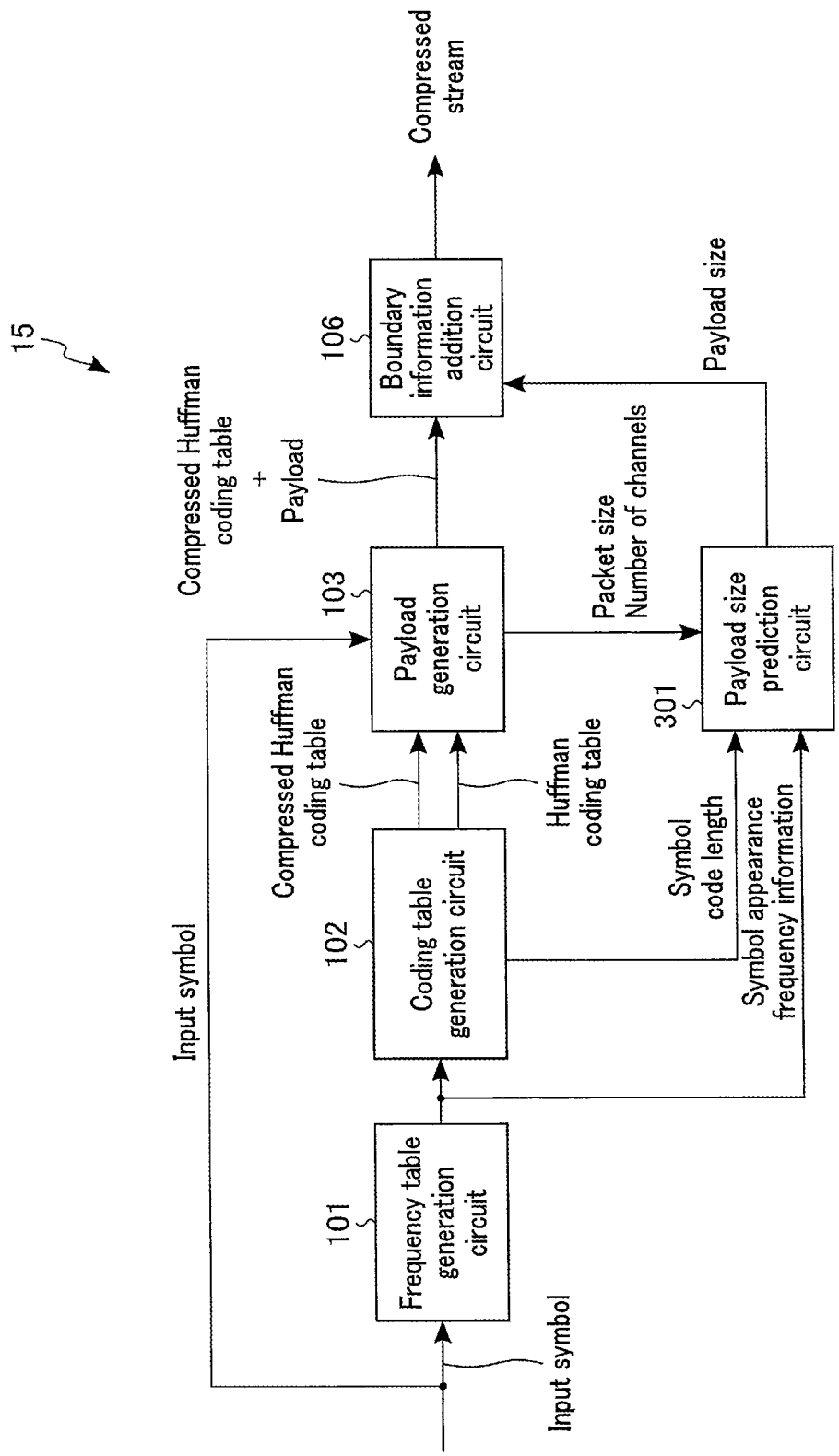
F I G. 10

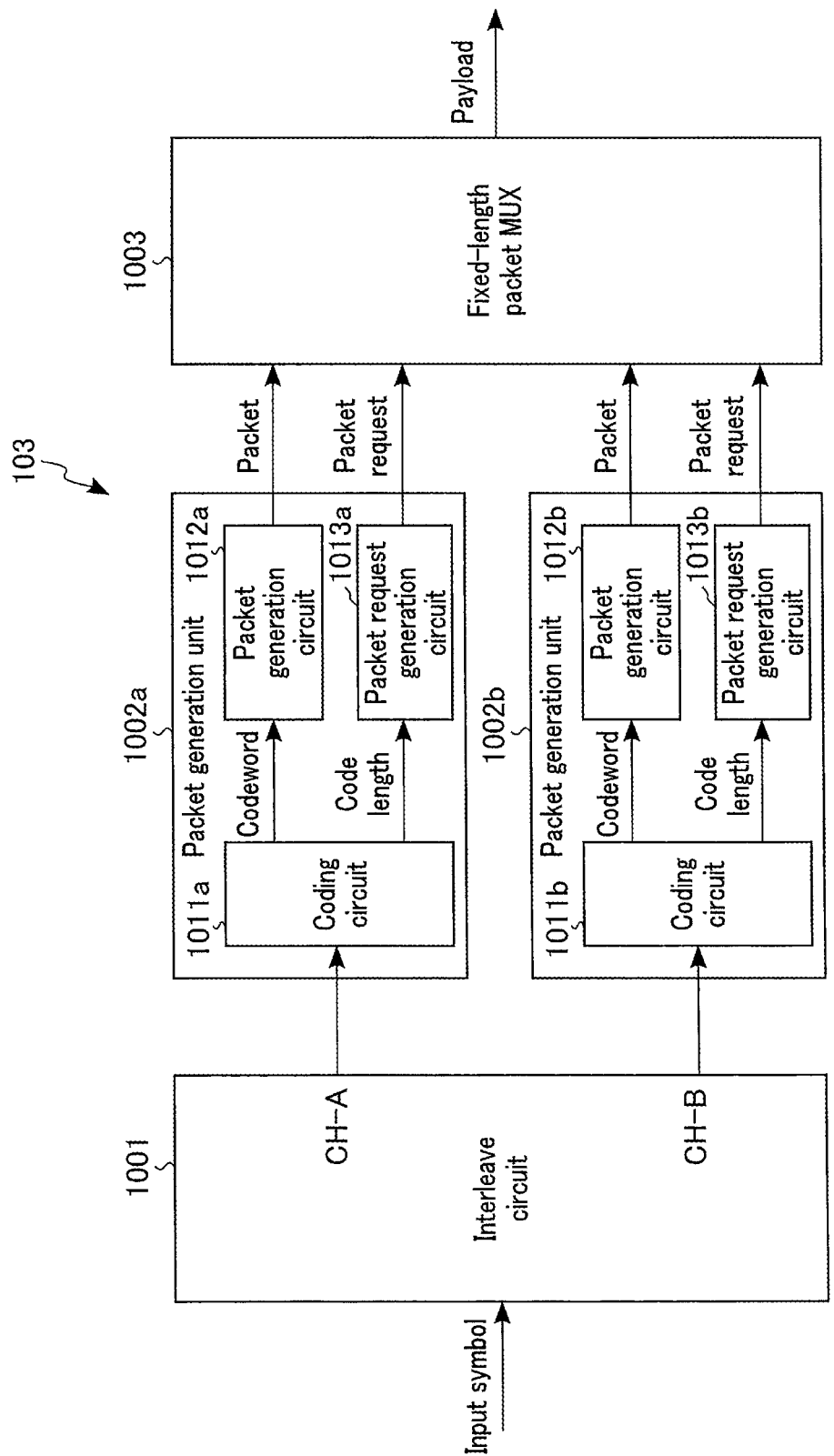
F I G. 11

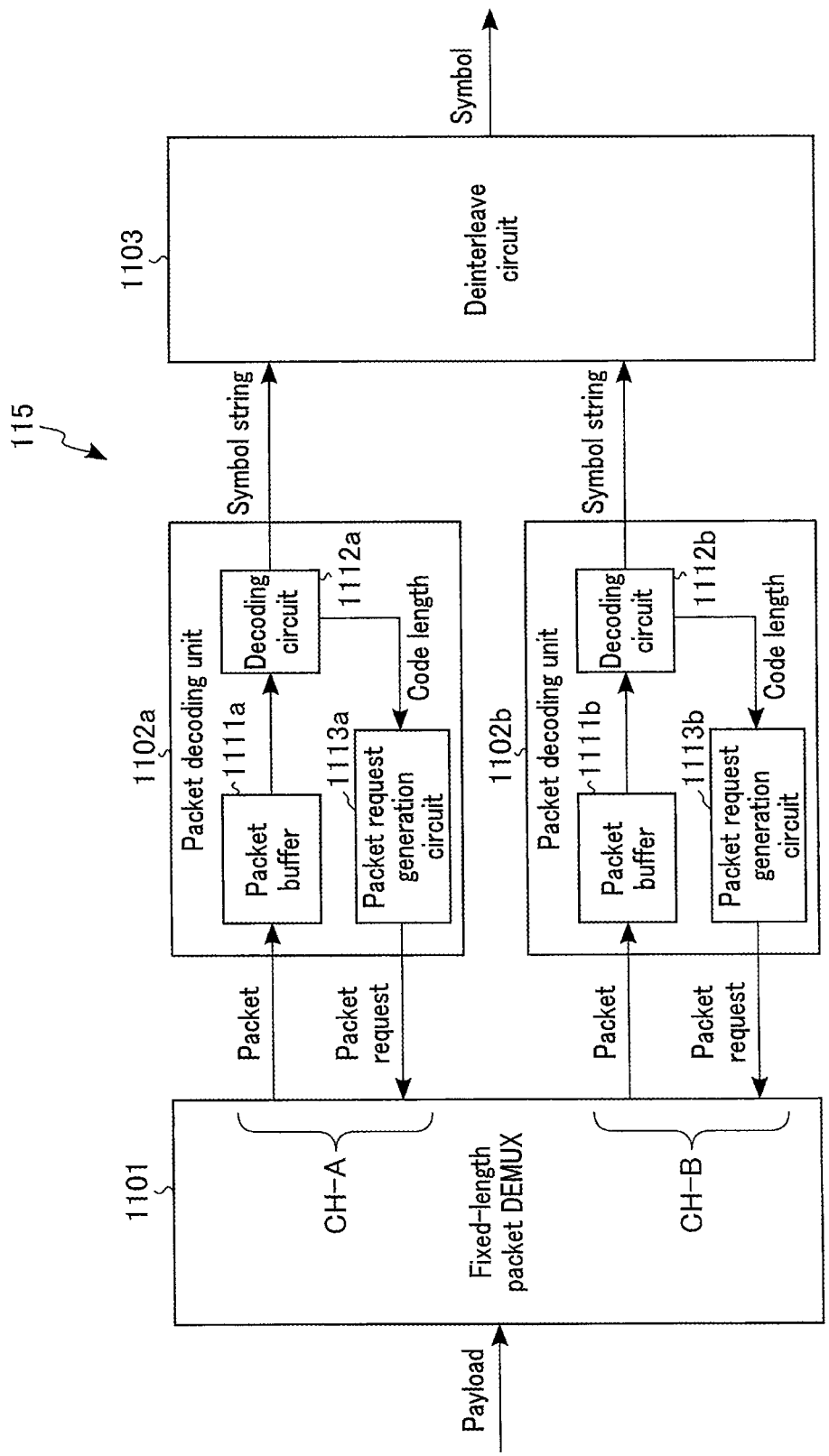
F I G. 12

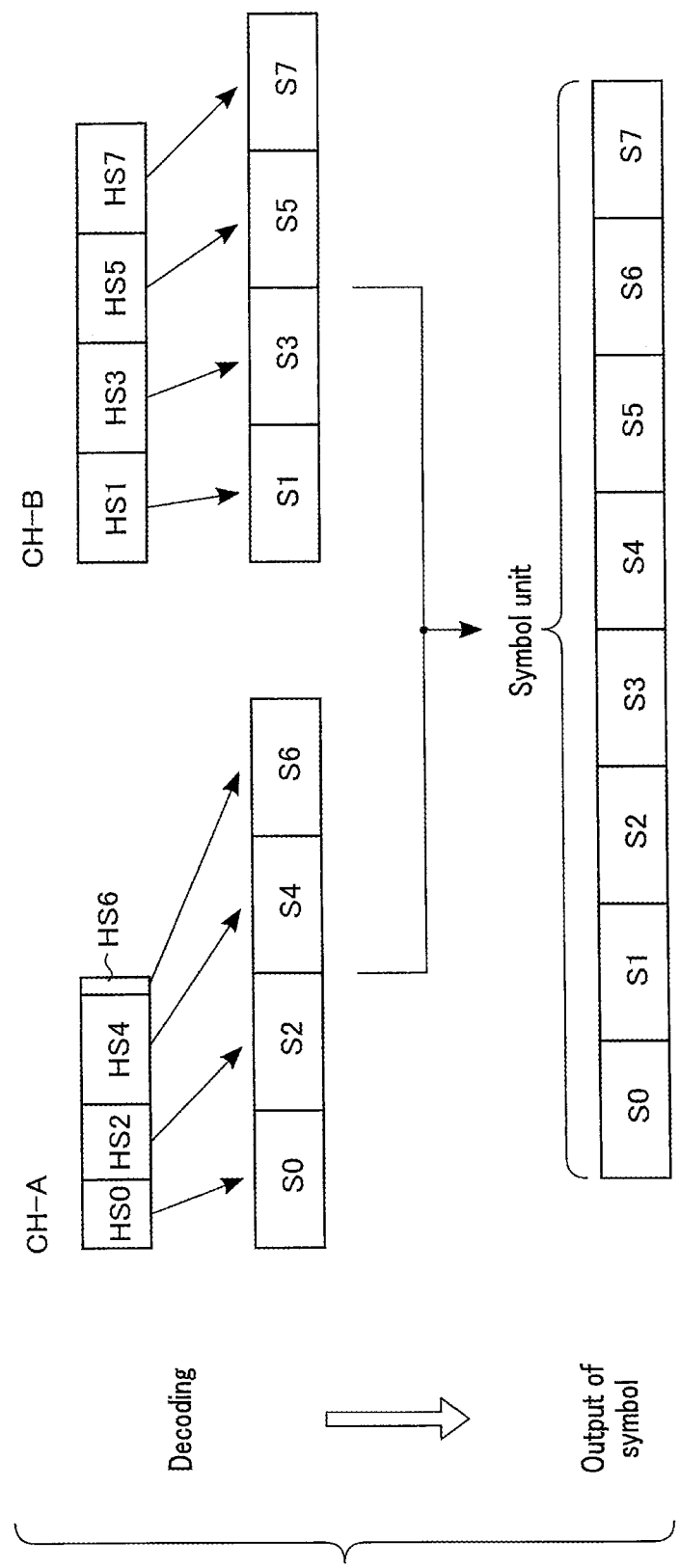
F I G. 17

DATA DECOMPRESSION DEVICE, DATA COMPRESSION DEVICE, AND MEMORY SYSTEM

CROSS-REFERENCE TO RELATED APPLICATIONS

This application is based upon and claims the benefit of priority from Japanese Patent Application No. 2021-152935, filed Sep. 21, 2021, the entire contents of which are incorporated herein by reference.

FIELD

Embodiments described herein relate generally to a data decompression device, a data compression device, and a memory system.

BACKGROUND

There is known a memory system using an SSD (Solid State Drive) that is equipped with a nonvolatile semiconductor memory such as a NAND flash memory.

As a compressed data format of an entropy coding method, a dynamic Huffman code is known. For example, a compressed stream compressed by dynamic Huffman coding according to RFC (Request For Comments) 1951, which is one of the deflate standards, includes a plurality of pairs each including a header including a compressed Huffman coding table and a payload including Huffman-coded data.

BRIEF DESCRIPTION OF THE DRAWINGS

FIG. 1 is a block diagram showing an example of an overall configuration of a data processing apparatus that includes a memory system according to a first embodiment.

FIG. 2 is a block diagram of a data compression device according to the first embodiment.

FIG. 3 is a block diagram of a data decompression device according to the first embodiment.

FIG. 4 is an example of a frequency table used in the first embodiment.

FIG. 5 is an example of a Huffman coding table used in the first embodiment.

FIG. 6 is a diagram showing an example of a compressed stream used in the first embodiment.

FIG. 7 is a flowchart illustrating how a data compression process is performed in the data compression device of the first embodiment.

FIG. 9 is a block diagram of a data compression device according to a second embodiment.

FIG. 10 is a block diagram of a data compression device according to a third embodiment.

FIG. 11 is a block diagram showing a configuration of a payload generation circuit of the third embodiment.

FIG. 12 is a block diagram showing a configuration of a payload decoding circuit of the third embodiment.

FIG. 17 is a flowchart illustrating how a data flow is at the time of payload decoding in the third embodiment.

DETAILED DESCRIPTION

Figure 8:
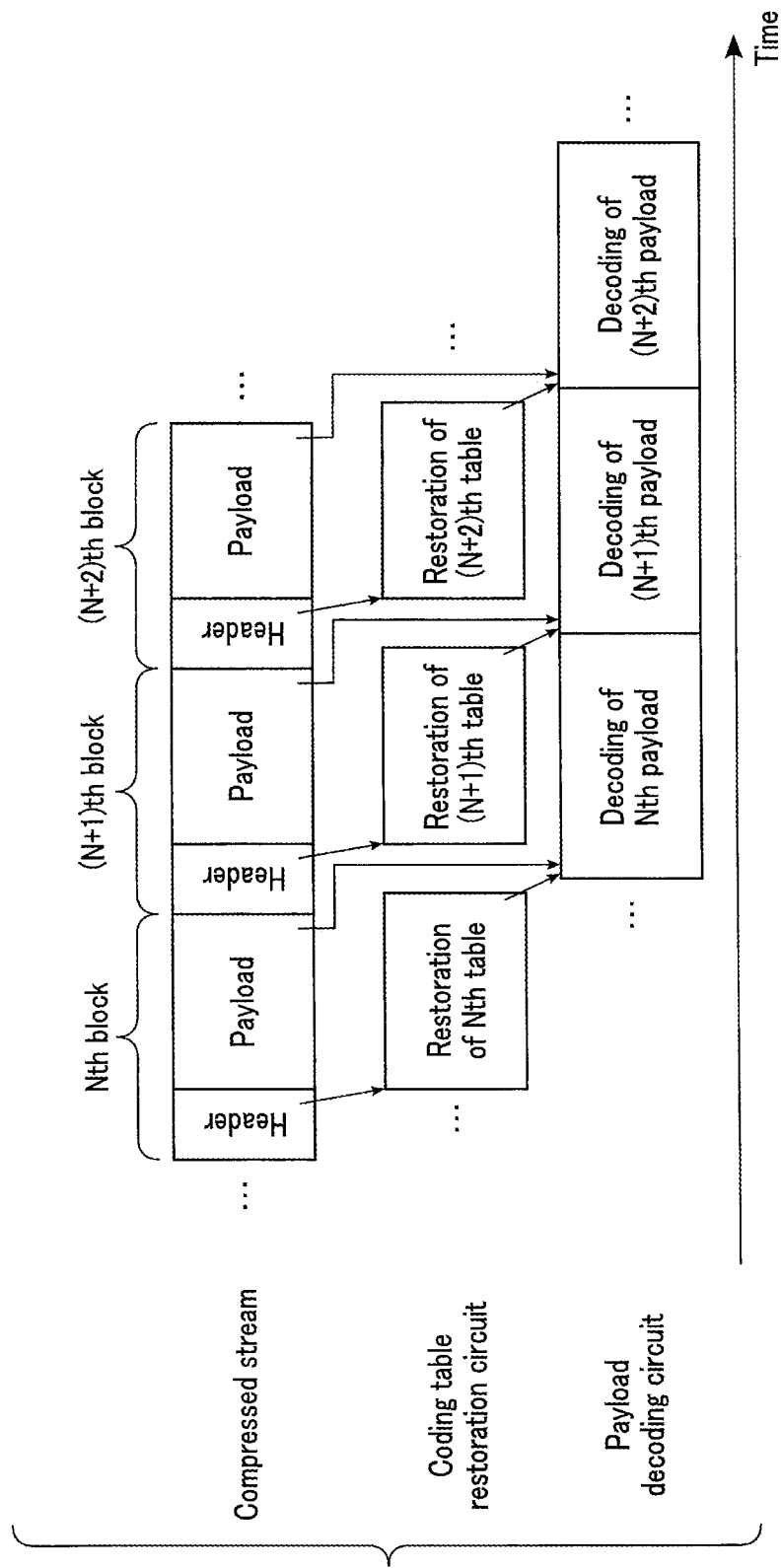
FIG. 8 is a diagram illustrating how a data decompression process is performed in the data decompression device of the first embodiment.

In general, according to one embodiment, a data decompression device includes: a detection circuit configured to detect a boundary between a header and a payload in a compressed stream, based on boundary information in the header; a separation circuit configured to separate the header and the payload; a first decompression circuit configured to decompress a compressed coding table in the header; and a second decompression circuit configured to decompress the payload, based on an output of the first decompression circuit.

Hereinafter, embodiments will be described with reference to the accompanying drawings. The drawings are schematic. In the description below, structural elements having the same functions and configurations will be denoted by the same reference symbols. The numbers after the letters of each reference symbol are used to distinguish between elements that have a similar configuration.

1. First Embodiment

1.1 Configuration

1.1.1 Configuration of Data Processing Apparatus

First, an example of the configuration of a data processing apparatus 1 having a memory system will be described with reference to FIG. 1. FIG. 1 is a block diagram showing an example of the overall configuration of the data processing apparatus 1.

As shown in FIG. 1, the data processing apparatus 1 includes a host device 2 and a memory system 3. A plurality of memory systems 3 may be coupled to the host device 2.

The host device 2 is an information processing device (computing device) that accesses the memory system 3. The host device 2 controls the memory system 3. More specifically, for example, the host device 2 requests (instructs) the memory system 3 to write or read data.

The memory system 3 is, for example, an SSD (Solid State Drive) provided with a nonvolatile memory. The memory system 3 is coupled to the host device 2, for example, via a host bus. The memory system 3 may be coupled to the host device 2 by wireless communications.

1.1.2 Configuration of Memory System

An example of the configuration of the memory system 3 will be described with reference to FIG. 1.

As shown in FIG. 1, the memory system 3 includes a memory controller 10 and a nonvolatile memory 20.

In response to a request (instruction) from the host device 2, the memory controller 10 instructs the nonvolatile memory 20 to perform a data read operation, a data write operation, a data erase operation, etc. The memory controller 10 manages the memory space of the nonvolatile memory 20.

The nonvolatile memory 20 includes, for example, a plurality of memory chips 21. Each memory chip 21 may be, for example, a NAND flash memory.

Next, a description will be given of the internal configuration of the memory controller 10. The memory controller 10 includes a host interface circuit 11, a processor (CPU; Central Processing Unit) 12, an internal memory (RAM; Random Access Memory) 13, a buffer memory 14, a data compression device 15, a data decompression device 16, and a memory interface circuit 17. These circuits are coupled to each other, for example, via a memory bus. Each of the functions of the memory controller 10 may be realized by a dedicated circuit, or may be realized by a processor that executes firmware.

The host interface circuit 11 is coupled to the host device 2 via the host bus and controls communications with the host device 2. The host interface circuit 11 transfers a request and data received from the host device 2 to the CPU 12 and the buffer memory 14, respectively. Further, the host interface circuit 11 transfers data of the buffer memory 14 to the host device 2 in response to an instruction of the CPU 12.

The CPU 12 controls the overall operation of the memory controller 10. For example, the CPU 12 instructs the nonvolatile memory 20 to perform a write operation, a read operation, and an erase operation, based on requests received from the host device 2. For example, the CPU 12 instructs the data compression device 15 to perform a data compression process. The CPU 12 instructs the data decompression device 16 to perform a data decompression process.

Further, the CPU 12 executes various processes for managing the nonvolatile memory 20, such as wear leveling. In addition, the CPU 12 executes various operations. For example, the CPU 12 executes a data encryption process, a randomization process, etc.

The internal memory 13 is, for example, a semiconductor memory such as a Dynamic Random Access Memory (DRAM), and is used as a work area of the CPU 12. The internal memory 13 stores firmware for managing the nonvolatile memory 20, various management tables, etc.

The buffer memory 14 temporarily holds read data which the memory controller 10 receives from the nonvolatile memory 20, input data which the memory controller 10 receives from the host device 2, etc.

The data compression device 15 is an encoder that compresses input data under the control of the CPU 12. In the present embodiment, the data compression device 15 generates a compressed stream compressed based on a dynamic Huffman coding. Huffman coding is a compression technique that assigns codewords with shorter code lengths (a smaller number of bits) to symbols that appear more frequently. The compressed stream includes a plurality of pairs (hereinafter referred to as "blocks") each including a header including a compressed Huffman coding table and a payload including Huffman-encoded data. More specifically, the data compression device 15 divides input data into, for example, units each containing a preset number of symbols (hereinafter referred to as "symbol units"). The number of symbols included in each symbol unit may be one or more. The data compression device 15 generates a block including a header and a payload, for each symbol unit (divided input data). The compressed stream is written to the nonvolatile memory 20 as write data, for example. Details of the compressed stream will be described later. After the compressed stream is generated by the data compression device 15, the CPU 12 may execute a predetermined process, such as an error correction coding process, for the compressed stream, and may write data obtained by executing the predetermined process for the compressed stream to the nonvolatile memory 20 by way of the interface circuit 17. That is, the CPU 12 may write the data based on the compressed stream generated by the data compression device 15 to the nonvolatile memory 20.

The data decompression device 16 is a decoder that decompresses a compressed stream (compressed data) under the control of the CPU 12. The data decompression device 16 decompresses (restores) a compressed Huffman coding table. The CPU 12 may execute a predetermined process, such as an error correction process, for data that is read from the nonvolatile memory 20 via the memory interface circuit 17, and then cause the data decompression device 16 to decompress the data obtained by executing the predetermined process for read data as a compressed stream. That is, the data decompression device 16 may decompress a compressed stream that is based on the data read from the nonvolatile memory 20. Then, the data decompression device 16 decodes the payload, using the restored Huffman coding table.

The memory interface circuit 17 is coupled to the nonvolatile memory 20 via a bus and controls communications with the nonvolatile memory 20. The memory interface circuit 17 transmits/receives data and various signals to/from the nonvolatile memory 20.

1.1.3 Data Compression Device

Next, a description will be given of an example of the configuration of the data compression device 15 with reference to FIG. 2. FIG. 2 is a block diagram of the data compression device 15.

As shown in FIG. 2, the data compression device 15 includes a frequency table generation circuit 101, a coding table generation circuit 102, a payload generation circuit 103, a delay buffer 104, a payload size counter 105, and a boundary information addition circuit 106.

The frequency table generation circuit 101 is a circuit that generates a frequency table. More specifically, the frequency table generation circuit 101 calculates a symbol type appearance frequency, for each symbol unit (divided input data). Then, the frequency table generation circuit 101 generates a different frequency table for each symbol unit, based on the calculation result. The symbol unit corresponds to the payload of one block in a compressed stream. The frequency table generation circuit 101 generates symbol appearance frequency information, based on the frequency table, and transmits it to the coding table generation circuit 102.

The coding table generation circuit 102 is a circuit that generates a Huffman coding table, based on input data. More specifically, a Huffman codeword having a variable code length is assigned to each symbol in the symbol unit, based on the symbol appearance frequency information received from the frequency table generation circuit 101. At this time, the coding table generation circuit 102 assigns a Huffman codeword to each symbol such that the code length of a symbol having a high frequency of appearance is short. The coding table generation circuit 102 generates a Huffman coding table showing the relationship between a symbol and a Huffman codeword. Like the frequency table generation circuit 101, the coding table generation circuit 102 generates a different Huffman coding table for each symbol unit.

The coding table generation circuit 102 compresses the Huffman coding table. The coding table generation circuit 102 transmits both an uncompressed Huffman coding table and compressed Huffman coding table to the payload generation circuit 103.

The payload generation circuit 103 generates a payload, based on a symbol unit (input data) and an uncompressed Huffman coding table. The payload includes a plurality of Huffman codewords having variable code lengths. Therefore, the payload size is different for each payload. The payload may include a terminal symbol at the end, indicating the end of the payload. The payload generation circuit 103 transmits the compressed Huffman coding table and the payload to the delay buffer 104. Further, the payload generation circuit 103 transmits the payload to the payload size counter 105.

The delay buffer 104 functions as a buffer for the compressed Huffman coding table and the payload. The delay buffer 104 delays the compressed Huffman coding table and the payload received from the payload generation circuit 103 and transmits them to the boundary information addition circuit 106.

The payload size counter 105 counts data size (number of bits) of the payload and generates information on the payload size. The payload size counter 105 transmits the information on the payload size to the boundary information addition circuit 106 as boundary information. That is, the payload size counter 105 generates boundary information. The boundary information is information indicating the end position of the payload in the compressed stream. In other words, the boundary information is information indicating the boundary position between a payload and the header of the next block. The boundary information may include information indicating the boundary between the header and the payload in the block.

The boundary information addition circuit 106 adds the boundary information to a position that is before the payload. The boundary information addition circuit 106 generates a header including boundary information and a compressed Huffman coding table. In the header, the boundary information may be arranged before the compressed Huffman coding table or after the compressed Huffman coding table. Further, the boundary information may be arranged such that it is interleaved with the compressed Huffman coding table data and the payload data. The boundary information addition circuit 106 outputs a pair including a header and a payload as one block of a compressed stream.

1.1.4 Data Decompression Device

Next, a description will be given of an example of the configuration of the data decompression device 16 with reference to FIG. 3. FIG. 3 is a block diagram of the data decompression device 16.

As shown in FIG. 3, the data decompression device 16 includes a boundary detection circuit 111, a de-multiplexer (DEMUX) 112, a coding table restoration circuit 113, a delay buffer 114, and a payload decoding circuit 115.

The boundary detection circuit 111 detects the boundary between blocks in a compressed stream and the boundary between a header and a payload in each block. The boundary detection circuit 111 transmits a control signal to the DEMUX 112, based on the detected boundaries. For example, the boundary detection circuit 111 sets the control signal to the Low ("L") level during the period when the compressed stream is a header, and sets the control signal to the High ("H") level during the period when the compressed stream is a payload.

The boundary detection circuit 111 receives a compressed stream. The boundary detection circuit 111 extracts payload size, for example, from the boundary information included in the compressed stream. In addition, the boundary detection circuit 111 receives a header end signal from the coding table restoration circuit 113. The header end signal is a signal indicating that the coding table restoration circuit 113 has detected the end of a header. For example, the header end signal is changed from the "L" level to the "H" level where the coding table restoration circuit 113 detects the end of the header.

Upon receipt of the "H" level header end signal, the boundary detection circuit ill switches the control signal from the "L" level to the "H" level. The boundary detection circuit 111 counts payloads of the compressed stream, based on the boundary information (payload size information). The boundary detection circuit 111 switches the control signal from the "H" level to the "L" level when the count reaches the payload size, i.e., when the compressed stream reaches the boundary between a payload and the next block header. The boundary detection circuit 111 repeats the above operation for each block of the compressed stream.

The DEMUX 112 is a separation circuit that separates a compressed stream into a header and a payload, based on a control signal received from the boundary detection circuit 111. The DEMUX 112 transmits the header to the coding table restoration circuit 113 during the "L" level of the control signal and transmits the payload to the delay buffer 114 during the "H" level of the control signal.

The coding table restoration circuit 113 is a decoding circuit (decompression circuit) that restores the compressed Huffman coding table included in the header. The coding table restoration circuit 113 transmits the restored Huffman coding table to the payload decoding circuit 115. Where the coding table restoration circuit 113 detects the end of a header, it transmits an "H" level header end signal to the boundary detection circuit 111.

The delay buffer 114 functions as a buffer for a payload received from the DEMUX 112. The delay buffer 114 can hold payloads of one or more blocks. The delay buffer 114 transmits the payload of a requested block to the payload decoding circuit 115, for example, based on a request of the payload decoding circuit 115.

The payload decoding circuit 115 is a decoding circuit (decompression circuit) that decodes a payload, based on the Huffman coding table. The payload decoding circuit 115 outputs a decoded symbol (data). The payload decoding circuit 115 includes a table buffer 116. The table buffer 116 can store Huffman coding tables of one or more blocks. Based on a Huffman coding table stored in the table buffer 116, the payload decoding circuit 115 decodes the corresponding payload.

1.2 Frequency Table

Next, a description will be given of an example of a frequency table with reference to FIG. 4. FIG. 4 shows an example of the frequency table. In the description below, reference will be made to the case where input data (input symbol) is a combination of five symbols "A" to "E".

As shown in FIG. 4, for example, the frequency table indicates a fixed-length code and an appearance frequency for each symbol. Where the five symbols "A" to "E" are represented by fixed-length codes, for example, 3-bit data is assigned. In the example shown in FIG. 4, a fixed-length code "000" is assigned to the symbol "A". A fixed-length code "001" is assigned to the symbol "B". A fixed-length code "010" is assigned to the symbol "C". A fixed-length code "011" is assigned to the symbol "D". A fixed-length code "100" is assigned to the symbol "E". That is, the input data is a combination of fixed-length codes "000", "001", "010", "011" and "100".

The frequency table generation circuit 101 calculates an appearance frequency of a fixed-length code for each type of the preset symbol (fixed-length code). That is, the frequency table generation circuit 101 counts an appearance time of each symbol in the symbol unit. The example shown in FIG. 4 illustrates a case where the number of symbols (fixed-length codes) included in the symbol unit is 20. For example, the frequency of appearance of the symbol "A" is 6. The frequency of appearance of the symbol "B" is 7. The frequency of appearance of the symbol "C" is 4. The frequency of appearance of the symbol "D" is 1. The frequency of appearance of the symbol "E" is 2.

1.3 Huffman Coding Table

Next, a description will be given of an example of a Huffman coding table with reference to FIG. 5. FIG. 5 is an example of the Huffman coding table.

As shown in FIG. 5, the Huffman coding table indicates, for example, a fixed-length code, a variable code length (number of bits) of a Huffman codeword, and a Huffman codeword, for each symbol. For example, where the Huffman coding table is generated based on the frequency table described with reference to FIG. 4, the appearance frequencies of the symbols are in the order of "B">"A">"C">"E">"D". In this case, number "1" is assigned to the code length of the symbol "B". Number "2" is assigned to the code length of the symbol "A". Number "3" is assigned to the code length of the symbol "C". Number "4" is assigned to the code length of the symbol "E". Number "4" is assigned to the code length of the symbol "D". Next, a Huffman codeword is assigned to each symbol; for example, a Huffman codeword "0" is assigned to the symbol "B". A Huffman codeword "10" is assigned to the symbol "A". A Huffman codeword "110" is assigned to the symbol "C". A Huffman codeword "1110" is assigned to the symbol "E". A Huffman codeword "1111" is assigned to the symbol "D".

1.4 Configuration of Compressed Stream

Next, a description will be given of an example of the configuration of a compressed stream with reference to FIG. 6. FIG. 6 is a diagram showing an example of the compressed stream.

As shown in FIG. 6, the compressed stream is a repetition of a plurality of blocks. For example, assuming that the number of blocks in the compressed stream is M (M is an integer of 2 or more), the Nth block (N is an integer not less than 1 and not more than M) includes a header including boundary information and a compressed Huffman coding table, and a payload including Huffman-coded symbols (i.e., a plurality of Huffman codewords). The other blocks have a similar configuration. Since a Huffman codeword is a variable length code, the payload size of the Nth block and the payload size of another block (for example, the (N+1)th block) are different.

1.5 Data Compression Process

Next, a description will be given of an example of a data compression process (a compressed stream generation process) with reference to FIG. 7. FIG. 7 is a flowchart illustrating how the data compression process is performed in the data compression device 15.

As shown in FIG. 7, upon receipt of input data (input symbol), the data compression device 15 first sets a variable N representing a block number to 1 (step S11). That is, the data compression device 15 first starts generating a first block.

The frequency table generation circuit 101 generates a frequency table corresponding to a symbol unit (step S12). Then, the frequency table generation circuit 101 transmits symbol appearance frequency information based on the frequency table to the coding table generation circuit 102 (step S13).

The coding table generation circuit 102 generates a Huffman coding table, based on the symbol appearance frequency information (step S14). Further, the coding table generation circuit 102 compresses the Huffman coding table to generate a compressed Huffman coding table (step S15). The coding table generation circuit 102 arranges the Huffman coding table and the compressed Huffman coding table in this order and transmits them to the payload generation circuit 103.

The payload generation circuit 103 Huffman-encodes the symbol unit using the Huffman coding table, to thereby generate a payload (step S16). The payload generation circuit 103 transmits the compressed Huffman coding table and the payload to the delay buffer 104. Further, the payload generation circuit 103 transmits the payload to the payload size counter 105.

The payload size counter 105 counts data size of the payload (step S17). The payload size counter 105 transmits the payload size information to the boundary information addition circuit 106 as boundary information.

The boundary information addition circuit 106 adds boundary information to the header (step S18). Thus, a header including the boundary information and the compressed Huffman coding table is generated. The data compression device 15 outputs the header and the payload as the Nth block of the compressed stream.

Where the input data (next symbol unit) remains (Yes in step S19), the data compression device 15 counts up the variable N (step S20). Then, the data compression device 15 proceeds to step S12 to generate the next block.

Where the input data (next symbol unit) does not remain (No in step S19), that is, where N=M, the data compression device 15 ends the data compression process.

1.6 Data Decompression Process

Next, a description will be given of a data decompression process with reference to FIG. 8. FIG. 8 is a diagram illustrating how a data flow is in the data decompression device 16 at the time of the data decompression process.

As shown in FIG. 8, the data decompression process includes a restoration process of compressed Huffman coding tables and a decoding process of payloads. Upon receipt of a compressed stream, the data decompression device 16 of the present embodiment executes the restoration process of a compressed Huffman coding table and the decoding process of a payload of a different block in parallel.

More specifically, for example, the data decompression device 16 receives a compressed stream. For example, upon receipt of a compressed Huffman coding table included in the header of an Nth block (which table may also be referred to simply as "Nth table"), the coding table restoration circuit 113 performs the restoration process of the Nth table. The payload of the Nth block (which payload may also be referred to simply as "Nth payload") is held in the delay buffer 114 until the restoration process of the Nth table is completed. When the restoration process of the Nth table is completed, the coding table restoration circuit 113 transmits the restored Nth table to the table buffer 116 of the payload decoding circuit 115. The payload decoding circuit 115 receives the Nth payload from the delay buffer 114. The payload decoding circuit 115 executes the decoding process of the Nth payload.

While the payload decoding circuit 115 is executing the decoding process of the Nth payload, the coding table restoration circuit 113 performs the restoration process of the (N+1)th table. That is, the decoding process of the Nth payload and the restoration process of the (N+1)th table are executed in parallel. In other words, the process of decoding the payloads of different blocks and the process of restoring the compressed Huffman coding tables are executed in parallel.

The (N+1)th payload is held in the delay buffer 114 until the restoration process of the (N+1)th table is completed. When the restoration process of the (N+1)th table is completed, the coding table restoration circuit 113 transmits the restored (N+1)th table to the table buffer 116 of the payload decoding circuit 115. When the decoding process of the Nth payload is completed, the payload decoding circuit 115 receives the (N+1)th payload from the delay buffer 114. The payload decoding circuit 115 executes the decoding process of the (N+1)th payload.

While the payload decoding circuit 115 is executing the decoding process of the (N+1)th payload, the coding table restoration circuit 113 performs the restoration process of the (N+2)th table. That is, the decoding process of the (N+1)th payload and the restoration process of the (N+2)th table are executed in parallel.

The (N+2)th payload is held in the delay buffer 114 until the restoration process of the (N+2)th table is completed. When the restoration process of the (N+2)th table is completed, the coding table restoration circuit 113 transmits the restored (N+2)th table to the table buffer 116 of the payload decoding circuit 115. When the decoding process of the (N+1)th payload is completed, the payload decoding circuit 115 receives the (N+2)th payload from the delay buffer 114. The payload decoding circuit 115 executes the decoding process of the (N+2)th payload.

As described above, while the payload decoding circuit 115 is executing the decoding process of the Nth payload, the coding table generation circuit 102 executes the restoration process of the compressed Huffman coding table of the next block. Therefore, the payload decoding circuit 115 can continuously execute the payload decoding process of each block without waiting for the completion of the restoration process of the compressed Huffman coding table.

In connection with the example shown in FIG. 8, reference was made to the case where the coding table restoration circuit 113 executes the restoration process of the (N+1)th compressed Huffman coding table during the decoding process of the Nth payload, but this is not restrictive. The coding table restoration circuit 113 may execute the restoration process of the (N+2)th and subsequent compressed Huffman coding tables during the decoding process of the Nth payload. That is, while the payload decoding circuit 115 is decoding the Nth payload, the coding table restoration circuit 113 executes the restoration process of the (N+K)th compressed Huffman coding table in parallel. It should be noted that K is an integer of 1 or more, and (N+K) is an integer of M or less.

1.7 Advantages of Present Embodiment

With the configuration of the present embodiment, the memory system 3 can improve the throughput of a data decompression process. This advantage will be described in detail.

Where a compressed stream that has a compressed Huffman coding table (header) and Huffman-coded data (payload) is decompressed for each block, the compressed Huffman coding table is first restored, and then the decoding process for the payload is executed using the restored Huffman coding table. Therefore, the restoration process of a compressed Huffman coding table and the decoding process of a payload are repeated for each block. Thus, an output blank due to the restoration process of the compressed Huffman coding table occurs between the outputs of the decoded data (symbols) of each block.

In contrast, with the configuration of the present embodiment, the data decompression device 16 can execute the restoration process of a compressed Huffman coding table and the decoding process of a payload of a different block in parallel. In other words, while the payload decoding circuit 115 is performing the decoding process of the payload of the Nth block, the coding table restoration circuit 113 can execute the restoration process of the compressed Huffman coding table of the (N+K)th block. Thus, the data decompression device 16 can continuously output the decoded data of each block without an output blank which may be generated due to the restoration process of a compressed Huffman coding table. Therefore, the memory system 3 can improve the throughput of the data decompression process.

In addition, with the configuration of the present embodiment, the data compression device 15 can generate boundary information including payload size information. The data compression device 15 can generate a header including both boundary information and a compressed Huffman coding table. The boundary information allows the data decompression device 16 to detect the boundary between a block and the next block before the restoration process of the compressed Huffman coding table and the decoding process of payloads are executed.

2. Second Embodiment

Next, a description will be given of the second embodiment. In connection with the second embodiment, the configuration of the data compression device 15 different from that of the first embodiment will be described. In the description below, differences from the first embodiment will be mainly described.

2.1 Data Compression Device

A description will be given of an example of the configuration of the data compression device 15 with reference to FIG. 9. FIG. 9 is a block diagram of the data compression device 15.

As shown in FIG. 9, the data compression device 15 includes a frequency table generation circuit 101, a coding table generation circuit 102, a payload generation circuit 103, a boundary information addition circuit 106, and a payload size calculation circuit 201. The frequency table generation circuit 101, the coding table generation circuit 102, the payload generation circuit 103, and the boundary information addition circuit 106 are similar to those of the first embodiment described with reference to FIG. 2.

The payload size calculation circuit 201 receives symbol appearance frequency information from the frequency table generation circuit 101, and receives information on the code length of each symbol from the coding table generation circuit 102. The payload size calculation circuit 201 calculates payload size based on Formula 1, that is, it generates boundary information.

$$\text{Payload Size} = \Sigma_{s \in \text{all symbols}} \text{Frequency}(s) \times \text{Code Length}(s) \quad (1)$$

That is, the payload size calculation circuit 201 obtains a mathematical product of the appearance frequency and the variable code length for all symbols in the symbol unit, and calculates a total sum of them. More specifically, for example, where the symbols in the symbol unit have the relationship described with reference to FIGS. 4 and 5, the payload size is calculated as follows: 2×6 (symbol "A")+ 1×7 (symbol "B")+3×4 (symbol "C")+4×1 (symbol "D")+ 4×2 (symbol "E")=43 (bit).

The payload size calculation circuit 201 transmits the calculated payload size to the boundary information addition circuit 106.

2.2 Advantages of Present Embodiment

With the configuration of the present embodiment, the advantages similar to those of the first embodiment can be obtained. In addition, the configuration of the present embodiment enables payload size to be calculated before the generation of a payload. Therefore, the delay buffer is unnecessary, and the circuit providing cost and the output latency of the compression device can be reduced.

3. Third Embodiment

Next, a description will be given of the third embodiment. In connection with the third embodiment, reference will be made to the case where interleaving is applied as a method of generating and decoding payloads (which method will be hereinafter referred to as "interleaved storage method"). In the description below, the differences from the first and second embodiments will be mainly described.

3.1 Data Compression Device

First, a description will be given of an example of the configuration of a data compression device 15 with reference to FIG. 10. FIG. 10 is a block diagram of the data compression device 15.

The data compression device 15 of the present embodiment executes Huffman coding by an interleaved storage method. In this case, a plurality of fixed-length packets including a plurality of Huffman codewords are generated. A payload including a plurality of packets is configured.

As shown in FIG. 10, the data compression device 15 includes a frequency table generation circuit 101, a coding table generation circuit 102, a payload generation circuit 103, a boundary information addition circuit 106, and a payload size prediction circuit 301. The frequency table generation circuit 101, the coding table generation circuit 102, and the boundary information addition circuit 106 are similar to those of the first embodiment described with reference to FIG. 2.

The payload generation circuit 103 of the present embodiment includes a plurality of packet generation units coupled to a plurality of channels. Details of the configuration of the payload generation circuit 103 will be described later. The payload generation circuit 103 executes a parallel packet generation process by means of the plurality of packet generation units. Since a packet has a fixed length, there may be a case where the packet is not completely filled with Huffman codewords. In this case, invalid data is inserted in the packet. In the description below, the case where invalid data (padding) is inserted in part of the packet will be referred to as "partial padding". The case where all data in the packet are invalid data will be referred to as "all padding". It should be noted that partial padding and all padding may occur at most once in each channel.

The payload size prediction circuit 301 predicts payload size. In the interleaved storage method, partial padding and all padding may occur. Therefore, the payload size prediction circuit 301 predicts a maximum value that the payload size can take.

The payload size prediction circuit 301 receives symbol appearance frequency information from the frequency table generation circuit 101, and receives symbol code length information from the coding table generation circuit 102. The payload size prediction circuit 301 receives information on the packet size and the number of channels (that is, the number of parallel processes) from the payload generation circuit 103. The payload size prediction circuit 301 calculates, as predicted payload size, a sum of the total sum of the code lengths of all symbols and the predicted value (maximum value) of padding.

More specifically, the payload size prediction circuit 301 obtains a mathematical product of the appearance frequency of all symbols and the variable code length, and calculates a sum total as data size (A). The data size (A) is calculated according to Formula 1 mentioned in connection with the second embodiment.

The payload size prediction circuit 301 calculates a mathematical product of the maximum value of padding size (padding data size) in partial padding and the number of channels, as data size (B). The maximum value of padding size in partial padding corresponds to the case where 1-bit data is present in a packet. Therefore, the formula for calculating the data size (B) is: (B)=(packet size−1)×number of channels.

The payload size prediction circuit 301 calculates a mathematical product of the padding size (that is, the packet size) and the number of channels in all padding, as data size (C). Therefore, the formula for calculating the data size (C) is: (C)=packet size×number of channels. Therefore, the sum of the data size (B) and the data size (C) is a mathematical product of the number of channels and the value obtained by subtracting 1 bit from twice the packet size. In other words, the sum of the data size (B) and the data size (C) can be regarded as data size obtained by multiplying the number of parallel processes in the coding of the payload generation circuit 103 (or the number of parallel processes in the decoding of the payload decoding circuit 115) by the maximum value less than twice the packet size.

The payload size prediction circuit 301 transmits a calculation result of (A)+(B)+(C) to the boundary information addition circuit 106 as predicted payload size.

3.1.1 Configuration of Payload Generation Circuit

Next, a description will be given of an example of the configuration of the payload generation circuit 103 with reference to FIG. 11. FIG. 11 is a block diagram showing the configuration of the payload generation circuit 103. The example shown in FIG. 11 illustrates a case where the payload generation circuit 103 has a configuration of two channels, but this is not restrictive. The payload generation circuit 103 may have a configuration of three or more channels.

As shown in FIG. 11, the payload generation circuit 103 includes an interleave circuit 1001, packet generation units 1002a and 1002b, and a fixed-length packet multiplexer (MUX) 1003.

The interleave circuit 1001 decomposes a symbol unit into a plurality of symbol strings and distributes them to a plurality of channels. In the example shown in FIG. 11, the interleave circuit 1001 has two channels CH-A and CH-B.

The packet generation unit 1002a is a unit that generates a packet. The packet generation unit 1002a is coupled to the channel CH-A.

The packet generation unit 1002a includes a coding circuit 1011a, a packet generation circuit 1012a, and a packet request generation circuit 1013a.

The coding circuit 1011a is a circuit that Huffman-codes a symbol string. The coding circuit 1011a is coupled to the channel CH-A of the interleave circuit 1001. The coding circuit 1011a generates a Huffman codeword of the symbol string received via the channel CH-A. The coding circuit 1011a transmits the Huffman codeword to the packet generation circuit 1012a. Further, the coding circuit 1011a transmits information on the code length of the symbol string to the packet request generation circuit 1013a.

The packet generation circuit 1012a is a circuit that generates a packet. The packet generation circuit 1012a fills Huffman codewords in the order in which they are received, to thereby generate a fixed-length packet. The fixed length of the packet can be arbitrarily designed. The packet generation circuit 1012a transmits a packet to the fixed-length packet MUX 1003.

The packet request generation circuit 1013a is a circuit that generates a packet request. The packet request is a signal that is transmitted when a plurality of packet decoding units (described later) in the data decompression device 16 request a packet. When a payload is generated, the order in which the packets are arranged is set to be the same as the order in which the packets are requested in the data decompression device 16. Therefore, the packet request generation circuit 1013a generates the packet requests generated in the data decompression device 16 in a pseudo manner. The packet request generation circuit 1013a transmits a packet request to the fixed-length packet MUX 1003.

The packet generation unit 1002b is a unit that generates a packet. The packet generation unit 1002b is coupled to the channel. CH-B.

The packet generation unit 1002b includes a coding circuit 1011b, a packet generation circuit 1012b, and a packet request generation circuit 1013b. Since the internal configuration of the packet generation unit 1002b is similar to that of the packet generation unit 1002a, a description of the internal configuration of the packet generation unit 1002b will be omitted.

The fixed-length packet MUX 1003 arranges the packets generated by the packet generation units 1002a and 1002b, based on the packet requests, to thereby generate a payload.

3.2 Data Decompression Device

Next, a description will be given of an example of the configuration of the data decompression device 16. The configuration of the data decompression device 16 of the present embodiment is similar to that of the first embodiment described with reference to FIG. 3, except that the payload decoding circuit 115 has a configuration corresponding to the interleaved storage method. A description will be given of the internal configuration of the payload decoding circuit 115.

3.2.1 Configuration of Payload Decoding Circuit

A description will be given of an example of the configuration of the payload decoding circuit 115 with reference to FIG. 12. FIG. 12 is a block diagram showing the configuration of the payload decoding circuit 115. The example shown in FIG. 12 illustrates a case where the payload decoding circuit 115 has a configuration of two channels, but this is not restrictive. The payload decoding circuit 115 may have a configuration of three or more channels. The payload decoding circuit 115 is only required to have the same number of channels as the payload generation circuit 103.

As shown in FIG. 12, the payload decoding circuit 115 includes a fixed-length packet DEMUX 1101, packet decoding units 1102a and 1102b, and a deinterleave circuit 1103.

The fixed-length packet DEMUX 1101 decomposes a payload into fixed-length packets. The fixed-length packet DEMUX 1101 distributes the packets to a plurality of channels, based on packet requests. In the example shown in FIG. 12, the fixed-length packet DEMUX 1101 has two channels CH-A and CH-B.

The packet decoding unit 1102a is a unit that decodes a packet (Huffman codeword). The packet decoding unit 1102a is coupled to the channel CH-A.

The packet decoding unit 1102a includes a packet buffer 1111a, a decoding circuit 1112a, and a packet request generation circuit 1113a.

The packet buffer 1111a is a buffer of packets. The packet buffer 1111a holds a packet received via the channel CH-A.

The decoding circuit 1112a is a decoding circuit that decodes a packet, based on a Huffman coding table. The decoding circuit 1112a decodes received packets from the start positions. The decoding circuit 1112a executes the decoding process where the remaining amount of data in the packet buffer 1111a is larger than the packet size. The decoding circuit 1112a transmits the decoded symbol string to the deinterleave circuit 1103. Further, the decoding circuit 1112a transmits information on the code length of the symbol string to the packet request generation circuit 1113a.

The packet request generation circuit 1113a is a circuit that generates a packet request. The circuit configuration of the packet request generation circuit 1113a is similar to that of the packet request generation circuit 1013a of the packet generation unit 1002a. The packet request generation circuit 1113a calculates the remaining amount of data in the packet buffer 1111a, based on the received code length. Where the remaining amount of data in the packet buffer 1111a is smaller than the packet size, the packet request generation circuit 1113a transmits a packet request to the fixed-length packet DEMUX 1101.

The packet decoding unit 1102b is a unit that decodes a packet. The packet decoding unit 1102b is coupled to the channel CH-B.

The packet decoding unit 1102b includes a packet buffer 1111b, a decoding circuit 1112b, and a packet request generation circuit 1113b. Since the internal configuration of the packet decoding unit 1102b is similar to that of the packet decoding unit 1102a, a description of the internal configuration of the packet decoding unit 1102b will be omitted.

The deinterleave circuit 1103 arranges the received symbol strings in the order in which they are received, and outputs symbols (data).

3.3 Packet Request Generation Flow

Figure 13:
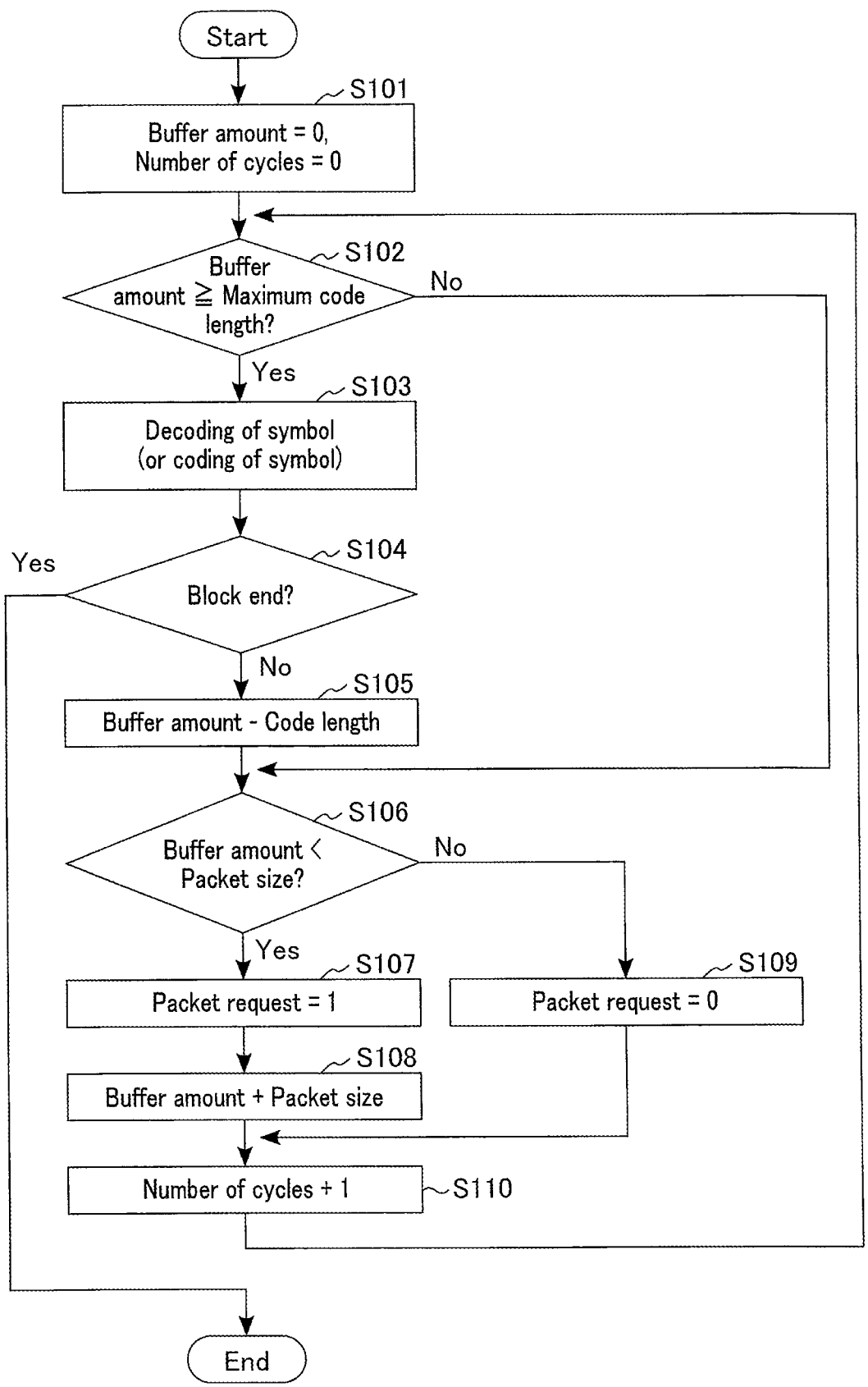
FIG. 13 is a flowchart illustrating how a packet request is generated in the third embodiment.

Next, with reference to FIG. 13, a description will be given of how a packet request is generated in the packet generation units 1002a and 1002b and the packet decoding units 1102a and 1102b. FIG. 13 is a flowchart illustrating how a packet request is generated.

The packet request generation circuit 1013a of the packet generation unit 1002a and the packet request generation circuit 1013b of the packet generation unit 1002b generate, in a pseudo manner, a packet request in the packet request generation circuit 1113a of the packet decoding unit 1102a and a packet request in the packet request generation circuit 1113b of the packet decoding unit 1102b. In the description below, reference will be given focusing on the packet request generation circuit 1113a of the packet decoding unit 1102a, unless otherwise indicated.

As shown in FIG. 13, the packet request generation circuit 1113a first sets both the amount of data held in the packet buffer 1111a (hereinafter referred to as "buffer amount") and the number of cycles to 0 (Step S101). The number of cycles indicates the number of decoding (or Huffman coding) cycles that are repeated for each symbol string.

Next, the packet request generation circuit 1113a confirms whether the buffer amount is equal to or larger than the maximum code length of the Huffman codeword (step S102).

Where the buffer amount is not equal to or larger than the maximum code length (No in step S102), the process proceeds to step S106.

Where the buffer amount is equal to or larger than the maximum code length (Yes in step S102), the decoding circuit 1112a (1112b) of the packet decoding unit 1102a (1102b) executes decoding of a symbol string (step S103). Where the packet request generation circuit is the packet request generation circuit 1013a (1013b) included in the packet generation unit 1002a (1002b), the coding circuit 1011a (1011b) executes Huffman coding of the symbol string.

Next, the packet request generation circuit 1113a confirms whether the target symbol string is data at the end of the block (symbol unit) (step S104).

Where the symbol string is the data at the end of the block (Yes in step S104), the packet request generation circuit 1113a ends the packet request.

On the other hand, where the symbol string is not the data at the end of the block (No in step S104), the packet request generation circuit 1113a subtracts the Huffman code length (number of bits) of the Huffman codeword of the target symbol string from the buffer amount (step S105).

Where the buffer amount is less than the packet size (Yes in step S106), the packet request generation circuit 1113a requests a packet from the fixed-length packet DEMUX 1101. That is, the packet request generation circuit 1113a sets the packet request of the cycle to 1 (step S107).

Next, the packet request generation circuit 1113a adds the packet size to the buffer amount (step S108).

On the other hand, where the buffer amount is not less than the packet size (No in step S106), the packet request generation circuit 1113a does not request a packet from the fixed-length packet DEMUX 1101. That is, the packet request generation circuit 1113a sets the packet request of the cycle to 0 (step S109).

Next, the packet request generation circuit 1113a counts up the number of cycles (step S110), then proceeds to step S102, and executes processing for the next symbol string.

3.4 Specific Example of Payload Generation

Figure 14:
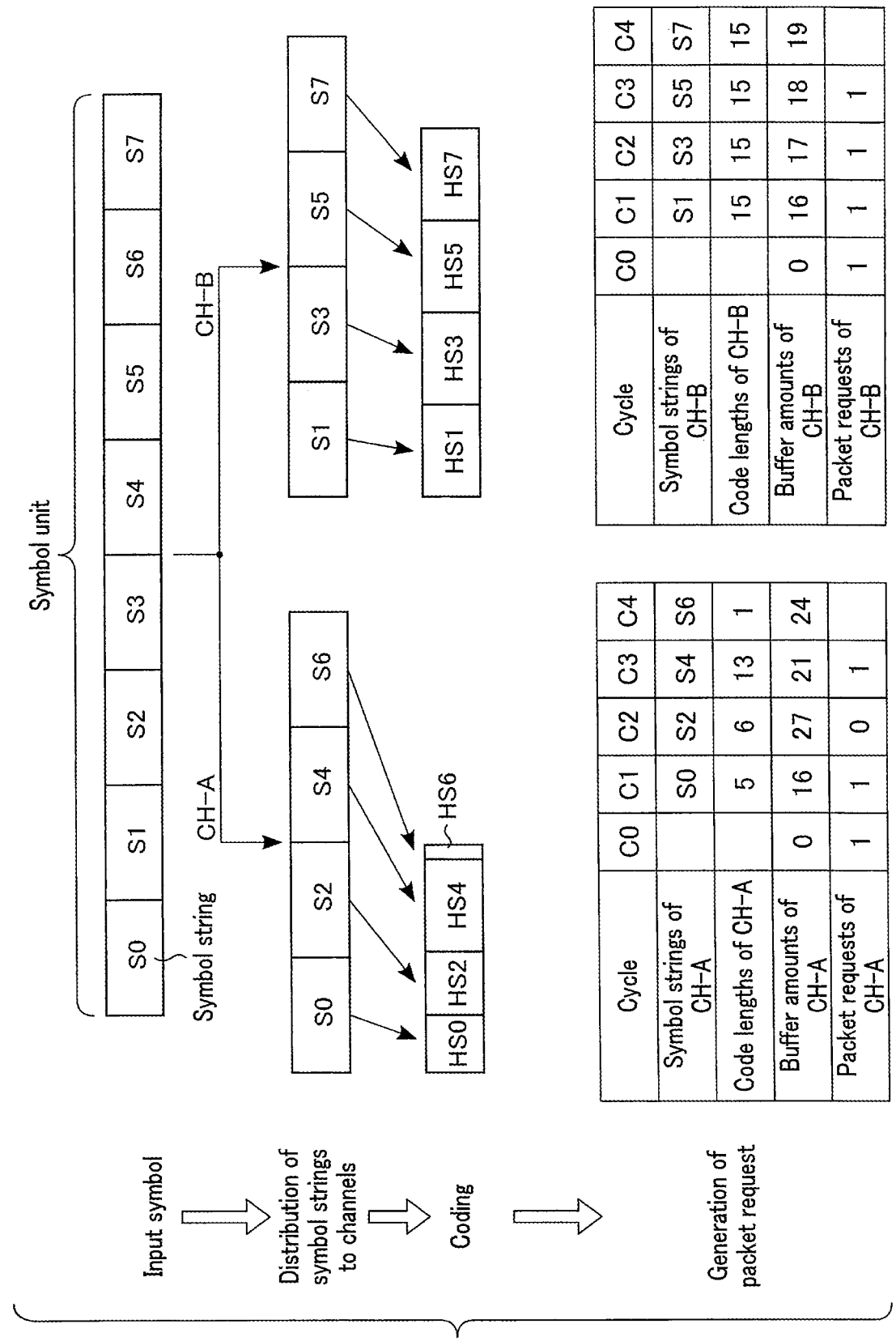
FIG. 14 is a flowchart illustrating how a data flow is at the time of payload generation in the third embodiment.
Figure 15:
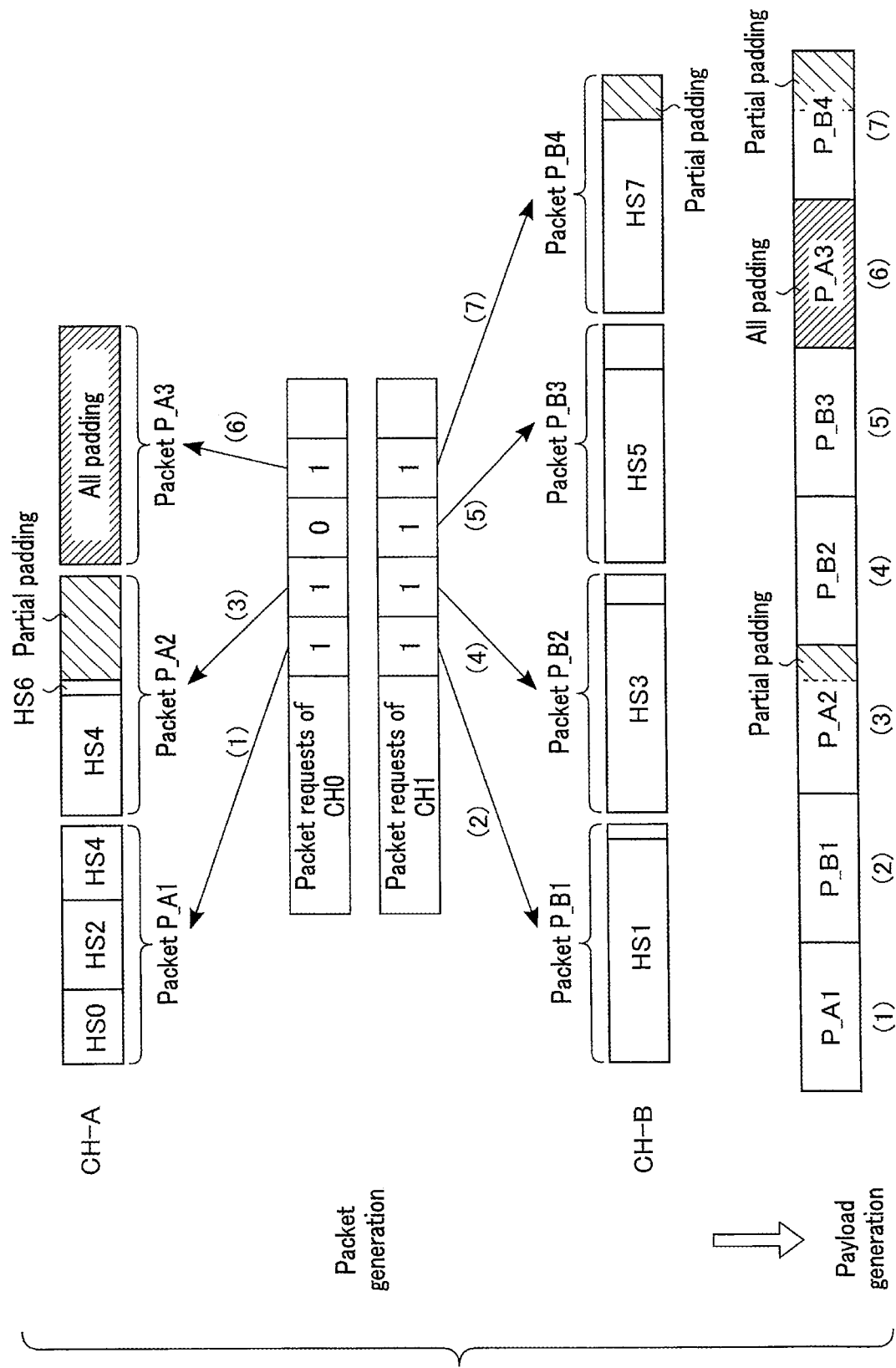
FIG. 15 is a flowchart illustrating how a data flow is at the time of payload generation in the third embodiment.

Next, with reference to FIGS. 14 and 15, a description will be given of a specific example of payload generation to which interleaving is applied. FIGS. 14 and 15 are flowcharts illustrating how a data flow is at the time of payload generation. In the description below, reference will be given of the case where the packet size is 16 bits.

As shown in FIG. 14, upon receipt of a symbol unit, the interleave circuit 1001 divides it into a plurality of symbol strings. In the example shown in FIG. 14, the symbol unit is divided into eight symbol strings S0 to S7. Then, for example, the interleave circuit 1001 distributes even-numbered symbol strings S0, S2, S4 and S6 to the packet generation unit 1002a coupled to the channel CH-A, and distributes odd-numbered symbol strings S1, S3, S5 and S7 to the packet generation unit 1002b coupled to the channel CH-B.

The coding circuit 1011a of the packet generation unit 1002a Huffman-codes the even-numbered symbol strings S0, S2, S4 and S6, and thereby generates Huffman codewords HS0, HS2, HS4 and HS6. For example, the code lengths of the Huffman codewords HS0, HS2, HS4 and HS6 are set to 5 bits, 6 bits, 13 bits, and 1 bit, respectively. Further, the coding circuit 1011b of the packet generation unit 1002b Huffman-codes the odd-numbered symbol strings S1, S3, S5 and S7, and thereby generates Huffman codewords HS1, HS3, HS5 and HS7. For example, the code lengths of the Huffman codewords HS1, HS3, HS5 and HS7 are all set to 15 bits. In this case, the maximum code length is 15 bits.

At this time, the packet request generation circuit 1013a (1013b) generates a packet request, based on the code length information received from the coding circuit 1011a (1011b).

First, a description will be given of how a packet request is generated in the packet generation unit 1002a, with reference to the table on the left side of the drawing sheet of FIG. 14 and corresponding to the channel CH-A.

The packet request generation circuit 1013a first sets the buffer amount to 0 in the first cycle C0. Therefore, the packet request generation circuit 1013a sets the packet request to 1.

In the next cycle C1, the buffer amount is 16 (=0+16). Since the buffer amount is more than the maximum code length (15 bits), the packet generation circuit 1012a sets the symbol string S0 as the symbol string of the cycle C1. For example, where the Huffman code length of the Huffman codeword HS0 of the symbol string S0 is 5 bits, the buffer amount is 11 bits (=16−5). Since the buffer amount is less than the packet size (16 bits), the packet request generation circuit 1013a sets the packet request to 1.

In the next cycle C2, the buffer amount is 27 bits (=11+16). Since the buffer amount is larger than the maximum code length, the packet generation circuit 1012a sets the symbol string S2 as the symbol string of the cycle C2. For example, where the Huffman code length of the Huffman codeword HS2 of the symbol string S2 is 6 bits, the buffer amount is 21 bits (=27−6). Since the buffer amount is larger than the packet size, the packet request generation circuit 1013a sets packet request to 0.

In the next cycle C3, the buffer amount is 21 bits. Since the buffer amount is larger than the maximum code length, the packet generation circuit 1012a sets the symbol string S4 as the symbol string of the cycle C3. For example, where the Huffman code length of the Huffman codeword HS4 of the symbol string S4 is 13 bits, the buffer amount is 8 bits (=21−13). Since the buffer amount is less than the packet size, the packet request generation circuit 1013a sets the packet request to 1.

In the next cycle C4, the buffer amount is 24 bits (=8+16). Since the buffer amount is larger than the maximum code length, the packet generation circuit 1012a sets the symbol string S6 as the symbol string of the cycle C4. Since the symbol string S6 is the data at the end of the block in the channel CH-A, the packet request generation circuit 1013a ends the packet request generation.

Next, a description will be given of how a packet request is generated in the packet generation unit 1002b, with reference to the table on the right side of the drawing sheet of FIG. 14 and corresponding to the channel CH-B.

The packet request generation circuit 1013b first sets the buffer amount to 0 in the first cycle C0. Therefore, the packet request generation circuit 1013b sets the packet request to 1.

In the next cycle C1, the buffer amount is 16 (=0+16). Since the buffer amount is larger than the maximum code length, the packet generation circuit 1012b sets the symbol string S1 as the symbol string of the cycle C1. For example, where the Huffman code length of the Huffman codeword HS1 of the symbol string S1 is 15 bits, the buffer amount is 1 bits (=16−15). Since the buffer amount is less than the packet size, the packet request generation circuit 1013b sets the packet request to 1.

In the next cycle C2, the buffer amount is 17 (=1+16). Since the buffer amount is larger than the maximum code length, the packet generation circuit 1012b sets the symbol string S3 as the symbol string of the cycle C2. For example, where the Huffman code length of the Huffman codeword HS3 of the symbol string S3 is 15 bits, the buffer amount is 2 bits (=17−15). Since the buffer amount is less than the packet size, the packet request generation circuit 1013b sets the packet request to 1.

In the next cycle C3, the buffer amount is 18 (=2+16). Since the buffer amount is larger than the maximum code length, the packet generation circuit 1012b sets the symbol string S5 as the symbol string of the cycle C3. For example, where the Huffman code length of the Huffman codeword HS5 of the symbol string S5 is 15 bits, the buffer amount is 3 bits (=18−15). Since the buffer amount is less than the packet size, the packet request generation circuit 1013b sets the packet request to 1.

In the next cycle C4, the buffer amount is 19 bits (=3+16). Since the buffer amount is larger than the maximum code length, the packet generation circuit 1012b sets the symbol string S7 as the symbol string of the cycle C4. Since the symbol string S7 is the data at the end of the block in the channel CH-B, the packet request generation circuit 1013b ends the packet request generation.

As shown in FIG. 15, the packet generation circuit 1012a (1012b) generates a packet, based on a Huffman codeword received from the coding circuit 1011a (1011b).

More specifically, the packet generation circuit 1012a generates a packet P_A1 including Huffman codewords HS0 and HS2 and a portion of the Huffman codeword HS4. The packet P_A1 corresponds to the packet request (1). Next, the packet generation circuit 1012a generates a packet P_A2 including the remaining portion of the Huffman codeword HS4 and the Huffman codeword HS6. At this time, partial padding is inserted in the remaining portion of the packet P_A2. The packet P_A2 corresponds to the packet request (3). Further, the packet generation circuit 1012a generates a packet P_A3 which is an all padding packet. The packet P_A3 corresponds to the packet request (6).

The packet generation circuit 1012b generates a packet P_B1 including the Huffman codeword HS1 and a portion of the Huffman codeword HS3. The packet P_B1 corresponds to the packet request (2). Next, the packet generation circuit 1012b generates a packet P_B2 including the remaining portion of the Huffman codeword HS3 and a portion of the Huffman codeword HS5. The packet P_B2 corresponds to the packet request (4). Next, the packet generation circuit 1012b generates a packet P_B3 including the remaining portion of the Huffman codeword HS5 and a portion of the Huffman codeword HS7. The packet P_B3 corresponds to the packet request (5). Next, the packet generation circuit 1012b generates a packet P_B4 including the remaining portion of the Huffman codeword HS7. At this time, partial padding is inserted in the remaining portion of the packet P_B4. The packet P_B4 corresponds to the packet request (7).

The fixed-length packet MUX 1003 arranges a plurality of packets received from the packet generation circuits 1012a and 1012b, based on the packet requests (1) to (7) received from the packet request generation circuits 1013a and 1013b, and thereby generates a payload. In the example shown in FIG. 15, the packet P_A1, the packet P_B1, the packet P_A2 (including partial padding), the packet P_B2, the packet P_B3, the packet P_A3 (all padding), and the packet P_B4 (including partial padding) are arranged in the order mentioned.

3.5 Specific Example of Payload Decoding

Figure 16:
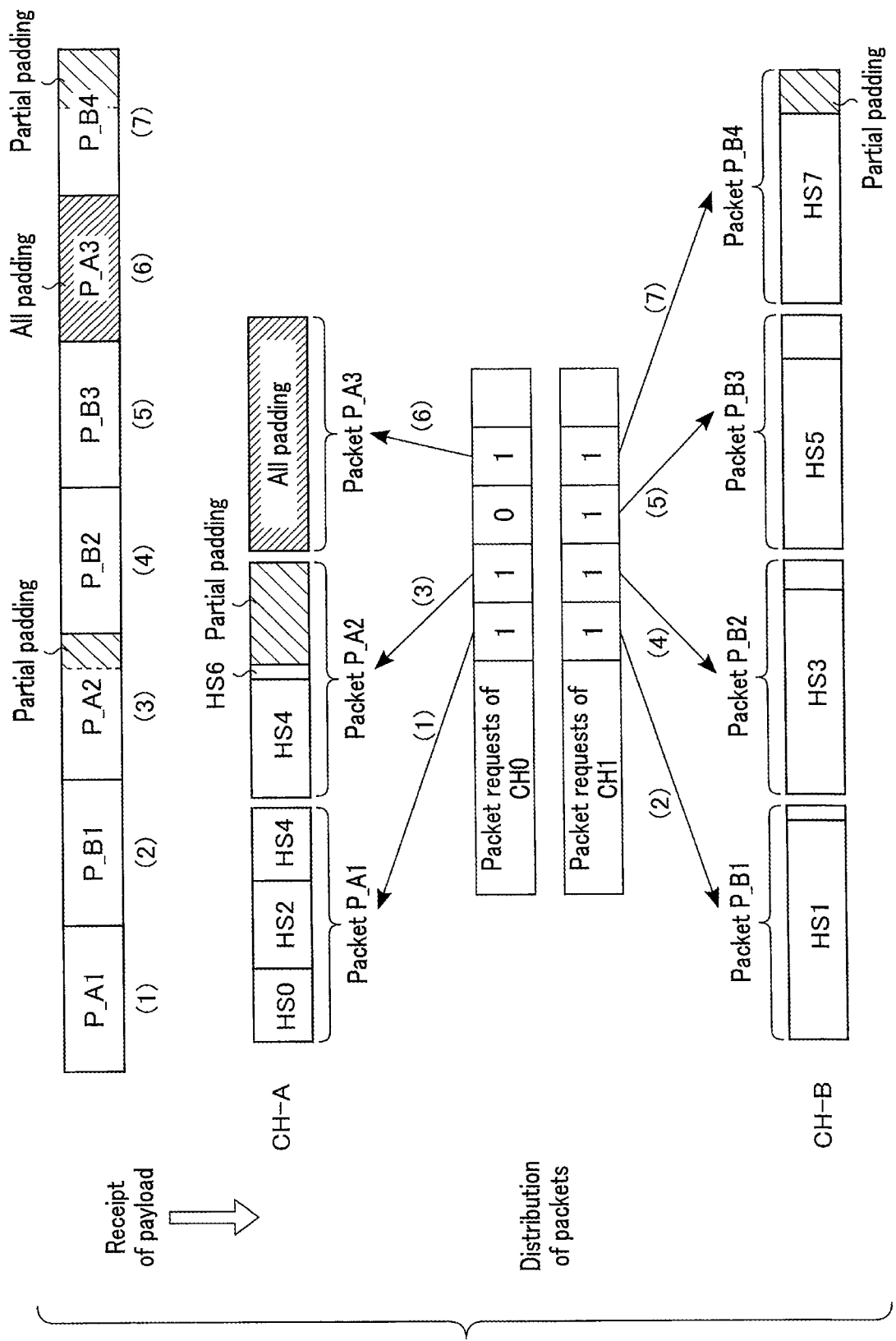
FIG. 16 is a flowchart illustrating how a data flow is at the time of payload decoding in the third embodiment.

Next, with reference to FIGS. 16 and 17, a description will be given of a specific example of payload decoding to which interleaving is applied. FIGS. 16 and 17 are flowcharts illustrating how a data flow is at the time of payload decoding.

As shown in FIG. 16, upon receipt of a payload, the fixed-length packet DEMUX 1101 divides it into packets. Then, the fixed-length packet DEMUX 1101 distributes the divided packets to the packet decoding units 1102a and 1102b, based on packet requests received from the packet request generation circuits 1113a and 1113b. For example, packets P_A1, P_A2 and P_A3 are transmitted to the packet decoding unit 1102a coupled to the channel CH-A, and packets P_B1, P_B2, P_B3 and P_B4 are transmitted to the packet generation unit 1002b coupled to the channel CH-B.

As shown in FIG. 17, the decoding circuit 1112a decodes Huffman codewords HS0, HS2, HS4 and HS6 to generate symbol strings S0, S2, S4 and S6. The decoding circuit 1112b decodes Huffman codewords HS1, HS3, HS5 and HS7 to generate symbol strings S1, S3, S5 and S7.

The deinterleave circuit 1103 arranges the symbol strings S0 to S7 received from the decoding circuits 1112a and 1112b in order and outputs symbols (data).

3.6 Advantages of Present Embodiment

With the configuration of the present embodiment, payload size can be predicted even if the payload includes padding. Thus, the same advantages as the second embodiment can be obtained.

Moreover, with the configuration of the present embodiment, the throughput of a data decompression process can be improved by applying the interleaved storage method.

4. Others

According to above embodiment, a data decompression device includes: a detection circuit (111) configured to detect a boundary between a header and a payload in a compressed stream, based on boundary information in the header; a separation circuit (112) configured to separate the header and the payload; a first decompression circuit (113) configured to decompress a compressed coding table in the header; and a second decompression circuit (115) configured to decompress the payload, based on an output of the first decompression circuit.

By applying the above embodiments, it is possible to provide a data decompression device capable of improving throughput.

The embodiments are not limited to the above-described ones, and various modifications can be made.

For example, in connection with the above embodiments, reference was made to the case where dynamic Huffman coding is applied, but this is not restrictive. Other methods may be used for compressing a coding table and data to generate a compressed stream.

Further, in connection with the above embodiments, reference was made to the case where the data compression device 15 and the data decompression device 16 are provided in the memory system 3, but this is not restrictive. The data compression device 15 and the data decompression device 16 may be provided in the host device 2 or may be provided in the nonvolatile memory 20. Alternatively, a single data compression/decompression device including both the data compression device 15 and the data decompression device 16 may be provided.

While several embodiments have been described, these embodiments have been presented by way of example and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A data decompression device comprising:
   a detection circuit configured to detect a boundary between a header and a payload in a compressed stream, based on boundary information in the header;
   a separation circuit configured to separate the header and the payload;
   a first decompression circuit configured to decompress a compressed coding table in the header; and
   a second decompression circuit configured to decompress the payload, based on an output of the first decompression circuit.

2. The data decompression device according to claim 1, wherein
   the compressed stream includes a plurality of pairs each including the header and the payload, and
   a decompression process of the coding table of an (N+K)th pair (N and K are integers of 1 or more) of the plurality of pairs in the first decompression circuit, and a decompression process of the payload of an Nth pair of the plurality of pairs in the second decompression circuit are executed in parallel.

3. The data decompression device according to claim 1, wherein
   the coding table is a Huffman coding table, and
   the payload includes data coded based on the Huffman coding table.

4. The data decompression device according to claim 1, wherein
   the separation circuit is configured to separate the header and the payload, based on a detection result of the detection circuit.

5. The data decompression device according to claim 1, further comprising:
   a delay circuit configured to delay a transmission of the payload from the separation circuit to the second decompression circuit.

6. The data decompression device according to claim 1, wherein
   the second decompression circuit includes a buffer for storing the payload, and
   the second decompression circuit decompresses the payload stored in the buffer, based on the coding table received from the first decompression circuit.

7. A data compression device comprising:
   a coding table generation circuit configured to generate a coding table, based on input data;
   a payload generation circuit configured to encode the input data, based on the coding table, and generate a payload;
   boundary information generation circuit configured to generate boundary information; and
   a boundary information addition circuit configured to add the boundary information to a position that is before the payload to generate a compressed stream.

8. The data compression device according to claim 7, wherein
   the boundary information generation circuit is configured to generate the boundary information by counting payload size.

9. The data compression device according to claim 7, further comprising:
   a frequency information generation circuit configured to calculate a symbol appearance frequency in the input data and generate symbol appearance frequency information, wherein
   the coding table generation circuit is configured to assign a codeword having a variable code length to a symbol included in the input data, based on the symbol appearance frequency information.

10. The data compression device according to claim 7, wherein
    the coding table generation circuit is configured to generate a compressed coding table.

11. The data compression device according to claim 7, wherein the compressed stream includes a compressed coding table.

12. The data compression device according to claim 7, further comprising:
    a frequency information generation circuit configured to calculate a symbol appearance frequency in the input data and generate symbol appearance frequency information, wherein
    the coding table generation circuit is configured to generate symbol code length information, and
    the boundary information generation circuit is configured to calculate payload size, using the symbol appearance frequency information and the symbol code length information, and generate the boundary information.

13. The data compression device according to claim 7, further comprising:
    a frequency information generation circuit configured to calculate a symbol appearance frequency in the input data and generate symbol appearance frequency information, wherein
    the coding table generation circuit is configured to generate symbol code length information,
    the payload includes padding, and
    the boundary information generation circuit is configured to generate the boundary information, based on data size calculated by using the symbol appearance frequency information and the symbol code length information, and on data size of the padding.

14. The data compression device according to claim 13, wherein
    the boundary information generation circuit is configured to generate the boundary information by adding a mathematical product of a number of parallel coding processes performed in the payload generation circuit and a value less than twice the data size of the padding to the data size calculated by using the symbol appearance frequency information and the symbol code length information.

15. The data compression device according to claim 7, wherein
the coding table is a Huffman coding table, and
the payload includes the input data coded based on the Huffman coding table.

16. A memory system comprising:
a data decompression device including:
- a detection circuit configured to detect a boundary between a header and a payload in a compressed stream, based on boundary information in the header;
- a separation circuit configured to separate the header and the payload;
- a first decompression circuit that decompresses a compressed coding table in the header; and
- a second decompression circuit configured to decompress the payload, based on an output of the first decompression circuit, and a data compression device including:
- a coding table generation circuit configured to generate a coding table, based on input data;
- a payload generation circuit configured to encode the input data, based on the coding table, and generate a payload;
- a boundary information generation circuit configured to generate boundary information; and
- a boundary information addition circuit configured to add the boundary information to a position that is before the payload to generate a compressed stream.

* * * * *